(12) United States Patent
Matsumoto et al.

(10) Patent No.: US 7,684,050 B2
(45) Date of Patent: Mar. 23, 2010

(54) SHAPE MEASURING APPARATUS, SHAPE MEASURING METHOD, AND EXPOSURE APPARATUS

(75) Inventors: Takahiro Matsumoto, Utsunomiya (JP); Ryo Sasaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 80 days.

(21) Appl. No.: 11/942,348

(22) Filed: Nov. 19, 2007

(65) Prior Publication Data

US 2008/0151258 A1    Jun. 26, 2008

(30) Foreign Application Priority Data

Dec. 22, 2006    (JP)    ............................. 2006-346203
Oct. 26, 2007    (JP)    ............................. 2007-278962

(51) Int. Cl.
*G01B 11/02*    (2006.01)

(52) U.S. Cl. ................................................... 356/514

(58) Field of Classification Search ......... 356/511–515, 356/521

See application file for complete search history.

(56) References Cited

U.S. PATENT DOCUMENTS

| | | | |
|---|---|---|---|
| 5,398,113 A | 3/1995 | de Groot | |
| 5,693,439 A | 12/1997 | Tanaka et al. | |
| 6,249,351 B1 | 6/2001 | de Groot | |
| 6,433,872 B1 | 8/2002 | Nishi et al. | |
| 7,292,346 B2 * | 11/2007 | De Groot et al. | 356/496 |
| 2006/0126076 A1 * | 6/2006 | Mueller et al. | 356/512 |
| 2006/0250598 A1 * | 11/2006 | Sasaki | 355/55 |

FOREIGN PATENT DOCUMENTS

| | | | |
|---|---|---|---|
| JP | 6-260391 A | | 9/1994 |
| JP | 2002206914 A | * | 7/2002 |
| JP | 2002286409 A | * | 10/2002 |
| WO | 2005022082 A1 | | 3/2005 |

* cited by examiner

*Primary Examiner*—Michael A Lyons
(74) *Attorney, Agent, or Firm*—Canon USA Inc IP Division

(57) ABSTRACT

A shape measuring method for measuring a surface shape of a measurement target includes dividing light from a light source into measurement light and reference light, the measurement light being obliquely incident upon a surface of the measurement target, the reference light being incident upon a reference mirror, introducing the measurement light reflected by the measurement target and the reference light reflected by the reference mirror to a photoelectric conversion element, detecting interference light formed by the measurement light and the reference light by the photoelectric conversion element while moving the measurement target, and measuring the surface shape of the measurement target based on an interference signal obtained from the measurement light that has been reflected at the same position on the surface of the measurement target.

9 Claims, 24 Drawing Sheets

FIG. 6
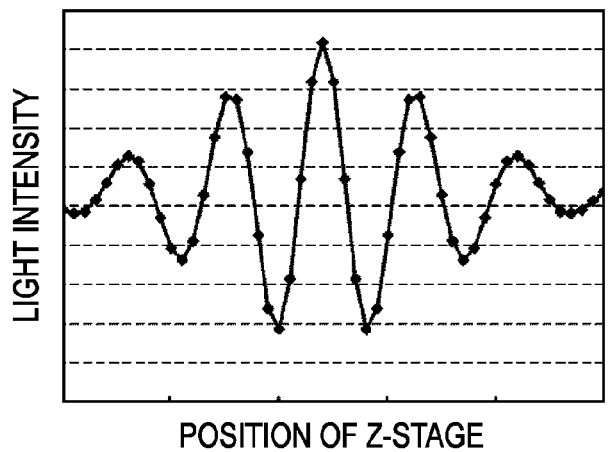
POSITION OF Z-STAGE
FIG. 7B
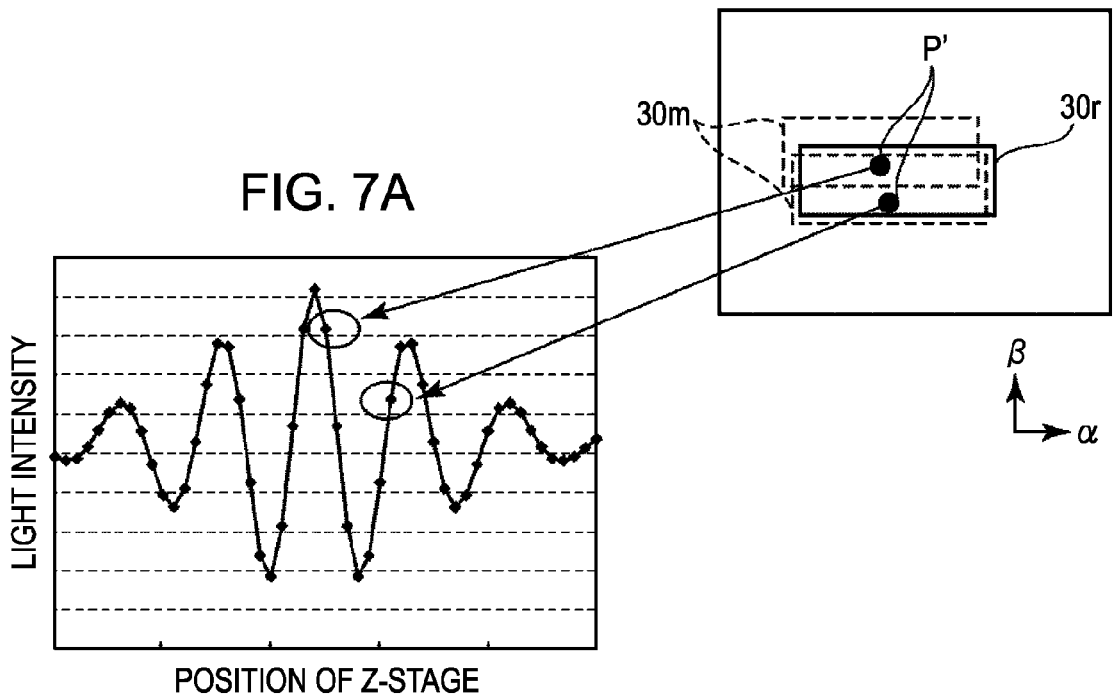
FIG. 7A
POSITION OF Z-STAGE

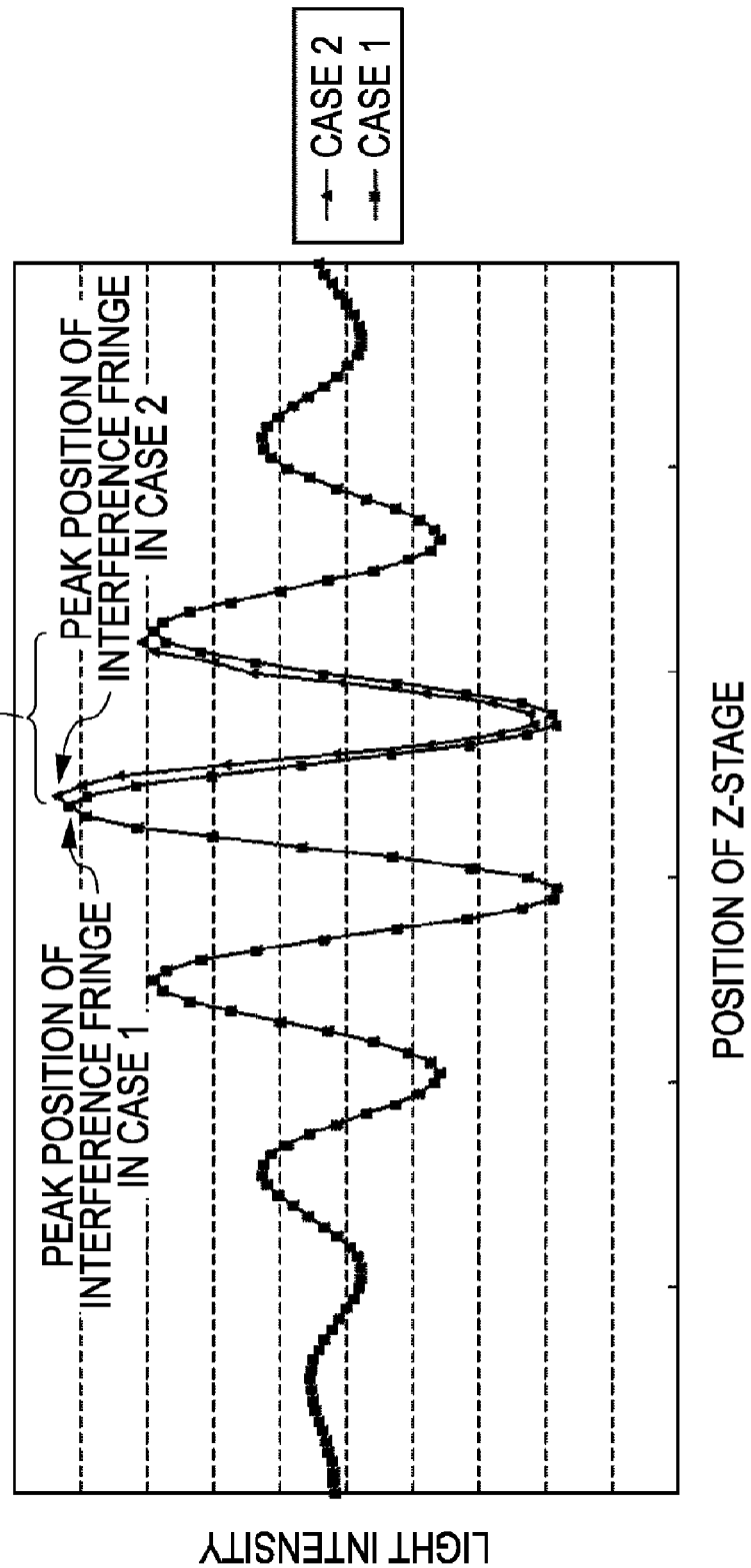

ARROW INDICATES DIRECTION OF INCIDENCE OF MEASUREMENT LIGHT

⊘ MEASUREMENT POINT OF 200A (INTERFEROMETER A)

△ MEASUREMENT POINT OF 200B (INTERFEROMETER B)

SHAPE MEASURING APPARATUS, SHAPE MEASURING METHOD, AND EXPOSURE APPARATUS

BACKGROUND OF THE INVENTION

1. Field of the Invention

The present invention relates to a shape measuring apparatus configured to measure a surface shape (figure or profile) of a measurement target, a shape measuring method configured to measure a surface shape of a measurement target, and an exposure apparatus including the shape measuring apparatus.

2. Description of the Related Art

As the background art of a shape measuring apparatus and an exposure apparatus including the shape measuring apparatus, the following description is given of, in particular, an example of a semiconductor exposure apparatus which requires severe measurement accuracy of a surface shape.

When a semiconductor device or a liquid crystal display device is produced by using the photolithography technique, a projection exposure apparatus is used in which a circuit pattern drawn on a reticle is projected for exposure to a wafer by a projection optical system.

In the projection exposure apparatus, with an increase in integration of semiconductor devices, the circuit pattern drawn on the reticle is demanded to be projected for exposure to the wafer at higher resolving power. A minimum dimension (or finest resolution) transferable by the projection exposure apparatus is directly proportional to the wavelength of light used for the exposure and is inversely proportional to the numerical aperture (NA) of the projection optical system. Accordingly, the shorter the wavelength of the exposure light, the higher is the resolving power. For that reason, light sources having shorter wavelengths, such as a KrF excimer laser (with a wavelength of about 248 nm) and an ArF excimer laser (with a wavelength of about 193 nm), have been recently used. Also, practical use of liquid immersion exposure has been progressed. In addition, further enlargement of an exposure area has been demanded.

To achieve those demands, a scanner has been mainly used instead of a step-and-repeat exposure apparatus (also called a "stepper") in which a substantially square exposure area is exposed to a wafer at a time with a reduction (scale-down). The scanner is a step-and-scan exposure apparatus in which an exposure area is formed as a rectangular slit and a reticle and a wafer are relatively scanned at a high speed to perform exposure of a large region with high accuracy.

In the scanner, before a predetermined position of the wafer reaches the exposure slit area, a surface position of the wafer at the predetermined position is measured by a surface position measuring unit (focus control sensor) with a light oblique incidence system. Based on the measured surface position of the wafer, a correction for aligning (registering) the wafer surface with an optimum imaging surface is performed when the predetermined position of the wafer is exposed.

Particularly, plural measurement points are set in the exposure slit area along the lengthwise direction of the exposure slit (i.e., along a direction perpendicular to the scanning direction) to measure not only the height of the wafer surface position (i.e., "focus"), but also the inclination of the wafer surface (i.e., "tilt"). As methods of measuring the focus and the tilt, there are known a method using an optical sensor (see Japanese Patent Laid-Open No. 6-260391 and U.S. Pat. No. 6,249,351), a method using a gas gauge sensor (see Pamphlet of International Publication WO2005/022082), and a method using a capacitance sensor.

In recent years, however, with the use of a shorter wavelength of the exposure light and a higher NA value of the projection optical system, the focal depth has become so extremely small that it is more difficult to realize satisfactory accuracy in aligning the exposed wafer surface with the optimum imaging surface, which is called focusing accuracy. In other words, some factors have become not negligible which include, particularly, the influence of a pattern on the wafer and errors in measurement of the surface position measuring apparatus, which are attributable to unevenness in the thickness of a resist coated on the wafer.

For example, the unevenness in the thickness of the resist causes a level difference, which is serious for the focus measurement although it is smaller than the focal depth, near a peripheral circuit pattern and a scribe line. Therefore, an inclination angle of the resist surface is increased to such an extent that reflected light, which is detected by the surface position measuring apparatus, is deviated from an angle of specular reflection due to reflection and/or refraction. Further, a difference in roughness/fineness of the pattern on the wafer generates a difference in reflectivity between a fine pattern area and a rough pattern area. Thus, because of changes in the angle of reflection and in the intensity of the reflected light which are detected by the surface position measuring apparatus, the waveform of a signal resulting from detecting the reflected light becomes asymmetric and a measurement error is caused.

FIG. 18 is a schematic view illustrating the case where measurement light MM is illuminated to a wafer SB having a difference in reflectivity when the optical sensor disclosed in Japanese Patent Laid-Open No. 6-260391 is used. In the illustrated case, the measurement light MM is inclined by an angle A relative to a boundary line between two areas differing in reflectivity, and the measurement is performed in a direction denoted by $\alpha'$. FIG. 19 plots intensity distributions of reflected light in three cross-sections spaced from each other in a direction denoted by $\beta'$, i.e., an AA' section, a BB' section, and a CC' section. As seen from FIG. 19, the reflected light has good symmetry in the AA' section and the CC' section, while the reflected light has an asymmetrical profile in the BB' section which includes both the areas differing in reflectivity. Such an asymmetrical profile shifts the barycenter in distribution of the reflected light and causes a measurement error. Accordingly, the wafer surface cannot be measured with high accuracy and a large defocus is generated, thus resulting in a chip failure.

FIG. 15 illustrates a shape measuring apparatus disclosed in U.S. Pat. No. 6,249,351 in which light is obliquely illuminated to a substrate and a shape of the substrate is measured based on a resulting interference signal. The disclosed shape measuring apparatus includes a light source 101, a lens 103, a beam splitter 105, a reference mirror 130, a driving mechanism 397, a beam combiner 170 formed of a grating, lenses 171 and 173, and an image pickup element 190. Wide-band light (white light) from the light source 101 is introduced to the beam splitter 105 through the lens 103 and is divided into reference light and measurement light. The reference light is reflected by the reference mirror 130 and the measurement light is reflected by a wafer 360 which is a sample. Those reflected lights are combined together by the beam combiner 170 formed of the grating. The reference light and the measurement light interfere with each other, and resulting interference light is introduced to the image pickup element 190 through the lenses 171 and 173.

The disclosed shape measuring apparatus also has the problem that the surface shape is erroneously measured by the influence of a circuit pattern on the wafer 360. That problem will be described in detail with reference to FIGS. 16, 17A and 17B.

FIG. 16 plots the intensity of the so-called "white interference signal" obtained in the shape measuring apparatus of FIG. 15 when the wafer 360 is moved by the driving mechanism 397 in a direction perpendicular to the wafer surface. A signal in Case 1 in FIG. 16 represents the case of measuring the wafer 360 having a structure in which no pattern is formed on the wafer 360 and only a resist is coated thereon as shown in FIG. 17A. On the other hand, a signal in Case 2 in FIG. 16 represents the case of measuring the wafer 360 having a more general structure in which a pattern is formed on the wafer 360 and a resist is coated the pattern as shown in FIG. 17B.

Looking at FIG. 16, in comparison with the signal in Case 1, the signal in Case 2 is affected by the pattern on the wafer 360 such that the interference signal is partly distorted. The distortion of the interference signal is attributable to a specific system of shape measuring apparatus of FIG. 15 in which, as shown in FIG. 17B, light is obliquely illuminated to the surface of the wafer 360 and the reflected light from the wafer surface is received. More specifically, when the wafer 360 is scanned in the direction perpendicular to the surface of the wafer 360, the position on the wafer 360 illuminated by the measurement light is shifted and a measurement point on the wafer 360 is changed. Therefore, the intensity of the reflected light is changed by the influence of the circuit pattern on the wafer and a correct interference signal cannot be obtained. Rays of light shown in FIGS. 17A and 17B represent only the light that passes the resist surface and is reflected by the wafer surface. In Case 2 of FIG. 16, because the reflectivity is partly increased, a peak position of the white interference signal is changed and an error is eventually generated in a value obtained by measuring the shape profile of the wafer.

Further, the method using a gas gauge sensor as described in Pamphlet of International Publication WO2005/022082 has the problem that minute particles mixed in gas are sprayed toward a wafer. As another problem, that method cannot be used in an exposure apparatus operated in vacuum, e.g., an EUV (Extreme Ultraviolet) exposure apparatus, because a vacuum level is deteriorated by the gas.

SUMMARY OF THE INVENTION

The present invention is directed to a measuring apparatus, shape measuring method, and exposure apparatus.

According to an aspect of the present invention, a shape measuring method is provided which can reduce the influence of a reflectivity distribution on the surface of a measurement target, and which can measure a surface shape of the measurement target with high accuracy.

According to an aspect of the present invention, a shape measuring method for measuring a surface shape of a measurement target includes dividing light from a light source into measurement light and reference light, the measurement light being obliquely incident upon a surface of the measurement target, the reference light being incident upon a reference mirror, introducing the measurement light reflected by the measurement target and the reference light reflected by the reference mirror to a photoelectric conversion element, detecting interference light formed by the measurement light and the reference light by the photoelectric conversion element while moving the measurement target, and measuring the surface shape of the measurement target based on an interference signal obtained from the measurement light that has been reflected at the same position on the surface of the measurement target.

According to another aspect of the present invention, a shape measuring apparatus is provided which is configured to measure a surface shape of a measurement target. The apparatus includes a light sending optical system arranged to divide light from a light source into measurement light and reference light, the measurement light being obliquely incident upon a surface of the measurement target, the reference light being incident upon a reference mirror; a light receiving optical system arranged to introduce the measurement light reflected by the measurement target and the reference light reflected by the reference mirror to a photoelectric conversion element; and a driving mechanism configured to move the measurement target. The photoelectric conversion element detects interference light formed by the measurement light and the reference light while the measurement target is moved. The surface shape of the measurement target is measured based on an interference signal obtained from the measurement light that has been reflected at the same position on the surface of the measurement target.

Further features and aspects of the present invention will become apparent from the following description of exemplary embodiments with reference to the attached drawings.

BRIEF DESCRIPTION OF THE DRAWINGS

FIG. 6 is a chart plotting an interference signal obtained in the first and second exemplary embodiments of the present invention.

FIG. 7A is a chart plotting an interference signal obtained in the third exemplary embodiments of the present invention.

FIG. 7B illustrates a light receiving surface of an image pickup element.

FIG. 16 is a chart illustrating a problem with the known shape measuring apparatus.

DESCRIPTION OF THE EMBODIMENTS

Figure 1:
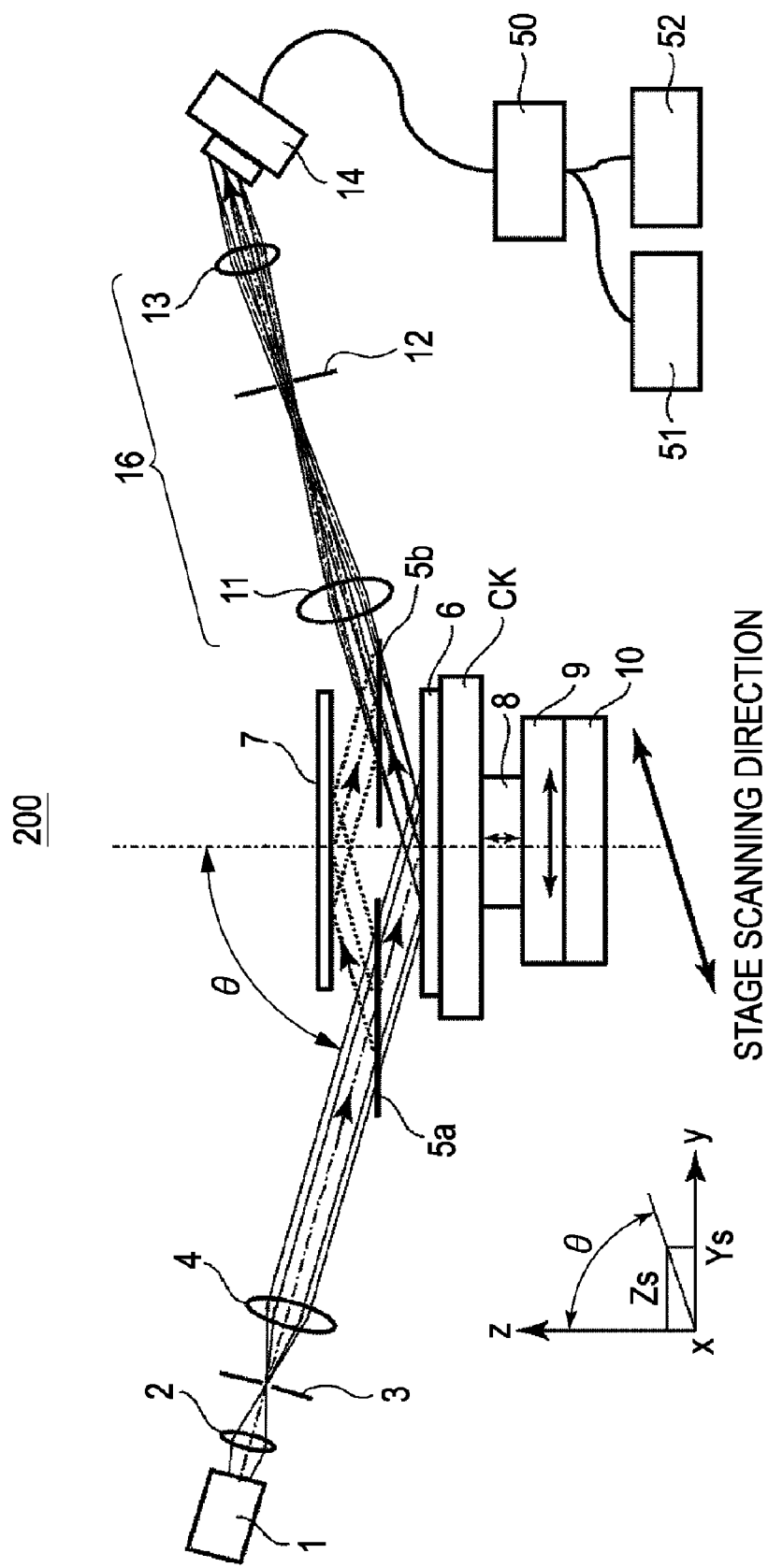
FIG. 1 is a schematic view illustrating an example shape measuring apparatus according to a first exemplary embodiment of the present invention.

Various exemplary embodiments of the present invention will be described below with reference to the accompanying drawings. Note that, in the accompanying drawings, similar components are denoted by the same reference numerals and a duplicate description of those components is omitted.

First Exemplary Embodiment

FIG. 1 is a schematic view illustrating a shape measuring apparatus 200 according to a first exemplary embodiment of the present invention. The shape measuring apparatus 200 measures a surface shape of a substrate 6 as a measurement target, i.e., height information (Z-position) at each of measurement points in an XY-plane. Also, the shape measuring apparatus 200 measures an average height in a predetermined area within the XY-plane and average tilt information ($\omega x$, $\omega y$). Further, when a plurality of thin films are formed on the substrate 6, the shape measuring apparatus 200 measures height information regarding any of the surface of an uppermost thin film, the interface between adjacent thin films, and the surface of the substrate 6 itself.

The shape measuring apparatus 200 is constituted by a light sending optical system, a stage system, a light receiving optical system, and a data processing system.

The light sending optical system includes a light source 1, a condenser lens 2 arranged to condense light emitted from the light source 1, a pin hole 3 and a lens 4 through which parallel light is illuminated to the substrate 6, and a beam splitter 5a arranged to split the light. The light source 1 is an LED (including the so-called white LED) or a halogen lamp, which emits wide-band light having a wide wavelength width. The beam splitter 5a divides the wide-band light from the light source 1 into a plurality of light beams.

The stage system is constituted by a substrate chuck CK which holds the measurement target (substrate) 6, and a driving mechanism which precisely aligns (registers) the position of the measurement target. The driving mechanism includes a Z-stage 8, a Y-stage 9, and an X-stage 10.

The light receiving optical system is constituted by a beam splitter 5b, an image pickup element (photoelectric conversion element) 14 such as a CCD or CMOS sensor, an imaging optical system made up of lenses 11 and 13 arranged to image the surface of the substrate 6 on the image pickup element 14, and an aperture stop 12. The beam splitter 5b combines the light reflected by the reference mirror 7 and the light reflected by the substrate 6 with each other.

The data processing system is constituted by a processing unit 50, a storage unit 51 storing data, and a display apparatus 52 which displays measured results and measurement conditions.

Detailed functions of the components in the first exemplary embodiment will be described below. In FIG. 1, the light emitted from the light source 1 is condensed to the pin hole 3 by the condenser lens 2 and is shaped to the parallel light through the lens 4. The light beam shaped to the parallel light impinges upon the substrate 6 at an angle $\theta$ of incidence. Because the beam splitter 5a is disposed midway a path of the parallel light, a light beam having about ½ of total light quantity is reflected by the beam splitter 5a and impinges upon the reference mirror 7 at the same angle $\theta$ of incidence as that for the substrate 6.

The light emitted from the light source 1 preferably has a wavelength band of 400 nm to 800 nm. However, the wavelength band of the emitted light is not limited to such a range and can also be set to a range of not shorter than 100 nm. If a resist is coated on the substrate 6, light having a wavelength of an ultraviolet ray (not longer than 350 nm) should not be illuminated to the substrate 6 for the purpose of preventing the resist from being sensitively exposed. The polarization state of the light is set to a non-polarized or a circularly-polarized state. When the angle $\theta$ of incidence of the light upon the substrate is increased, the reflectivity at the front surface of a thin film on the substrate 6 is relatively increased in comparison with the reflectivity at the rear surface of the thin film. Therefore, when a shape of the front surface of the thin film is measured, the angle $\theta$ of incidence is desired to be set as large as possible. On the other hand, if the angle $\theta$ of incidence approaches 90 degrees, a difficulty arises in assembling the optical system. For those reasons, the angle $\theta$ of incidence is preferably set to the range of 70 to 85 degrees in a practical example.

The beam splitter 5a can be formed as a cubic beam splitter in which a metal film, a dielectric multilayered film, or the like is used as a splitting film. As an alternative, the beam splitter 5a can also be formed as a pellicle beam splitter which is made of a thin film (of SiC or SiN) having a thickness of 1 µm to 5 µm.

The light having passed through the beam splitter 5a is illuminated to the substrate 6, and the reflected light from the substrate 6 (hereinafter referred to as "measurement light") enters the beam splitter 5b. On the other hand, the light reflected by the beam splitter 5a is illuminated to the reference mirror 7, and the reflected light from the reference mirror 7 (hereinafter referred to as "reference light") enters the beam splitter 5b. The reference mirror 7 can be formed of, e.g., an aluminum plane mirror having surface accuracy of 10 nm to 20 nm or a glass plane mirror having comparable surface accuracy.

The measurement light reflected by the substrate 6 and the reference light reflected by the reference mirror 7 are combined with each other by the beam splitter 5b and are both detected as interference light by the image pickup element 14. The beam splitter 5b can be formed of the same one as the beam splitter 5a. Midway a path of the combined light, the lenses 11 and 13 and the aperture stop 12 are disposed to perform the following functions. The lenses 11 and 13 form a both-side telecentric imaging optical system 16. Respective light receiving surfaces of the substrate 6 and the image pickup element 14 are arranged in the scheimpflug relation with respect to the imaging optical system 16. Therefore, the surface of the substrate 6 is imaged on the light receiving surface of the image pickup element 14. The aperture stop 12 disposed at the pupil position of the imaging optical system 16 serves to specify the numerical aperture (NA) of the imaging optical system 16 such that the NA is set to a very small value in the range of sin (0.5°) to sin (5°). On the light receiving surface of the image pickup element 14, the measurement light and the reference light are overlapped with each other to cause interference of both the lights, thereby forming interference fringes.

A description is now given of a method of obtaining an interference signal, which is an important point in the first exemplary embodiment. In FIG. 1, the substrate 6 is held by the substrate chuck CK and is placed on the Z-stage 8, the Y-stage 9, and the X-stage 10. The Z-stage 8 and the Y-stage 9 are driven to produce a white interference signal, shown in FIG. 6, at the image pickup element 14. On that occasion, the Z-stage 8 and the Y-stage 9 are simultaneously driven such that the substrate 6 is moved in a direction in which the reflected light from the substrate 6 advances (i.e., a direction in which the light is reflected at the same angle as the angle θ of incidence). In other words, the Z-stage 8 and the Y-stage 9 are driven such that a Z-stage driven amount Zs and a Y-stage driven amount Ys always satisfy the relationship of Ys/Zs=tan θ. The light intensity at each pixel of the image pickup element 14 corresponding to each reflection point on the substrate 6 is stored in the storage unit 51. When changing an area of the substrate 6 to be measured, the above-described measurement is performed after moving the desired area of the substrate 6 to be aligned with the light receiving area of the image pickup element 14 by driving the X-stage 10 and the Y-stage 9. The positions of the X-stage 10, the Y-stage 9, and the Z-stage 8 can be controlled with high accuracy by providing five interferometers in a one-to-one relation to three X-, Y- and Z-axes and two tilt axes ωx and ωy, and by executing closed loop control based on outputs of the interferometers. As a result, the accuracy in the shape measurement can be increased. In particular, when the entire shape of the substrate 6 is to be measured while dividing the substrate 6 into plural areas, plural sets of shape data can be more accurately stitched with each other by using the interferometers.

A description is now given of a method of obtaining the shape of the substrate 6 through signal processing of the white interference signal which is measured by the image pickup element 14 and stored in the memory. FIG. 6 shows the white interference signal obtained at a certain pixel of the image pickup element 14.

The white interference signal is also called an interferogram. In FIG. 6, the horizontal axis represents a value measured by a Z-axis gage interferometer after the Z-stage and the Y-stage have been driven, and the vertical axis represents the output of the image pickup element 14. Instead of the interferometer, a capacitance sensor can also be used as a gage sensor. A value of the measured height is obtained by calculating a peak position of the white interference signal and determining a measured value of the Z-axis gage interferometer corresponding to the peak position. By measuring the heights with all the pixels of the image pickup element 14, a three-dimensional shape of the substrate 6 can be measured. The signal peak position can be calculated by approximation using a curve (of, e.g., a quadratic function) based on data at the signal peak position and other several points thereabout. Such an approximation enables the signal peak position to be calculated at resolution in the range of 1/10 to 1/50 of a sampling pitch Zp in the Z-axis, i.e., the horizontal axis of FIG. 6. In practice, the sampling pitch Zp can be realized by driving the Z-stage actually step by step at a constant pitch Zp (while driving the Y-stage step by step at the same time). For the purpose of increasing a measurement speed, however, the Z-stage and the Y-stage are each desirably driven at a constant speed while keeping the relationship of Ysp/Zsp=tan θ (θ is the angle of incidence) on the assumption that the driving speed of the Z-stage is Zsp and the driving speed of the Y-stage is Ysp. In the latter case, the output of the Z-axis gage interferometer (Z-position) is taken in sync with the timing of taking in the output of the image pickup element 14.

The signal peak position can be measured by suitable one of known techniques, e.g., an FDA method (see U.S. Pat. No. 5,398,113). With the FDA method, a peak position in contrast is determined by using a phase gradient of a Fourier spectrum.

Thus, the key point in determining the resolution and the accuracy in the measurement method using the white interference signal resides in how to accurately obtain the position where a path length difference between the reference light and the measurement light is 0 (zero). To achieve the accuracy as high as possible, in addition to the FDA method, other various methods are also proposed, e.g., a method of determining envelop lines of white interference fringes by a phase shift method or a Fourier transform method and obtaining a path difference zero point from a maximum position in fringe contrast, as well as a phase cross-correlation method.

The above-described signal processing is executed by the processing unit 50 so as to obtain data representing the surface shape of the substrate 6. The obtained shape data is stored in the storage unit 51 and is displayed in the display apparatus 52.

Figure 2:
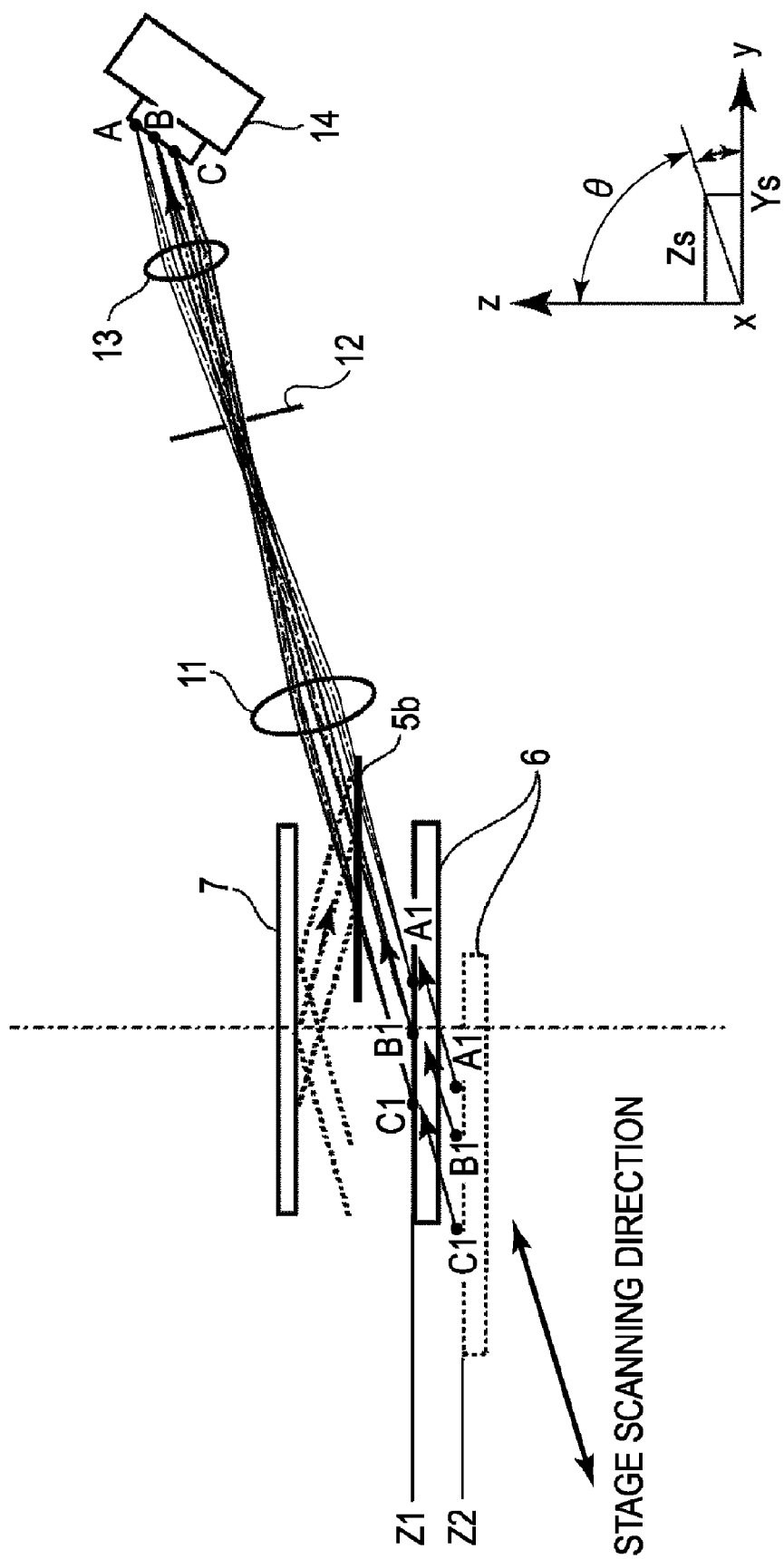
FIG. 2 is an explanatory view illustrating the detection principle in shape measurement in the first exemplary embodiment of the present invention.

The advantages of the first exemplary embodiment will be described with reference to FIG. 2. FIG. 2 illustrates, in an enlarged scale, a part of the shape measuring apparatus of FIG. 1. In FIG. 2, three measurement points A1, B1 and C1 exist on the surface of the substrate 6 to be measured by the Z-axis gage interferometer, and three measurement point images A, B and C corresponding to those measurement points exist on the image pickup element 14. Also, FIG. 2 shows respective positions of the measurement points A1, B1 and C1 on the substrate 6 when the Z-stage is driven to move from a position of a Z-coordinate Z1 to a position of a Z-coordinate Z2. By driving the Z-stage and the Y-stage parallel to the direction in which the light is reflected by the substrate 6, the positional relationship between the measurement points on the substrate 6 and images of the measurement point on the image pickup element 14 are not changed. That feature enables the measurement to be performed without being affected by the influence of a pattern distribution (i.e., a reflectively distribution) on the substrate 6 when the Z-stage is driven.

Second Exemplary Embodiment

Figure 3:
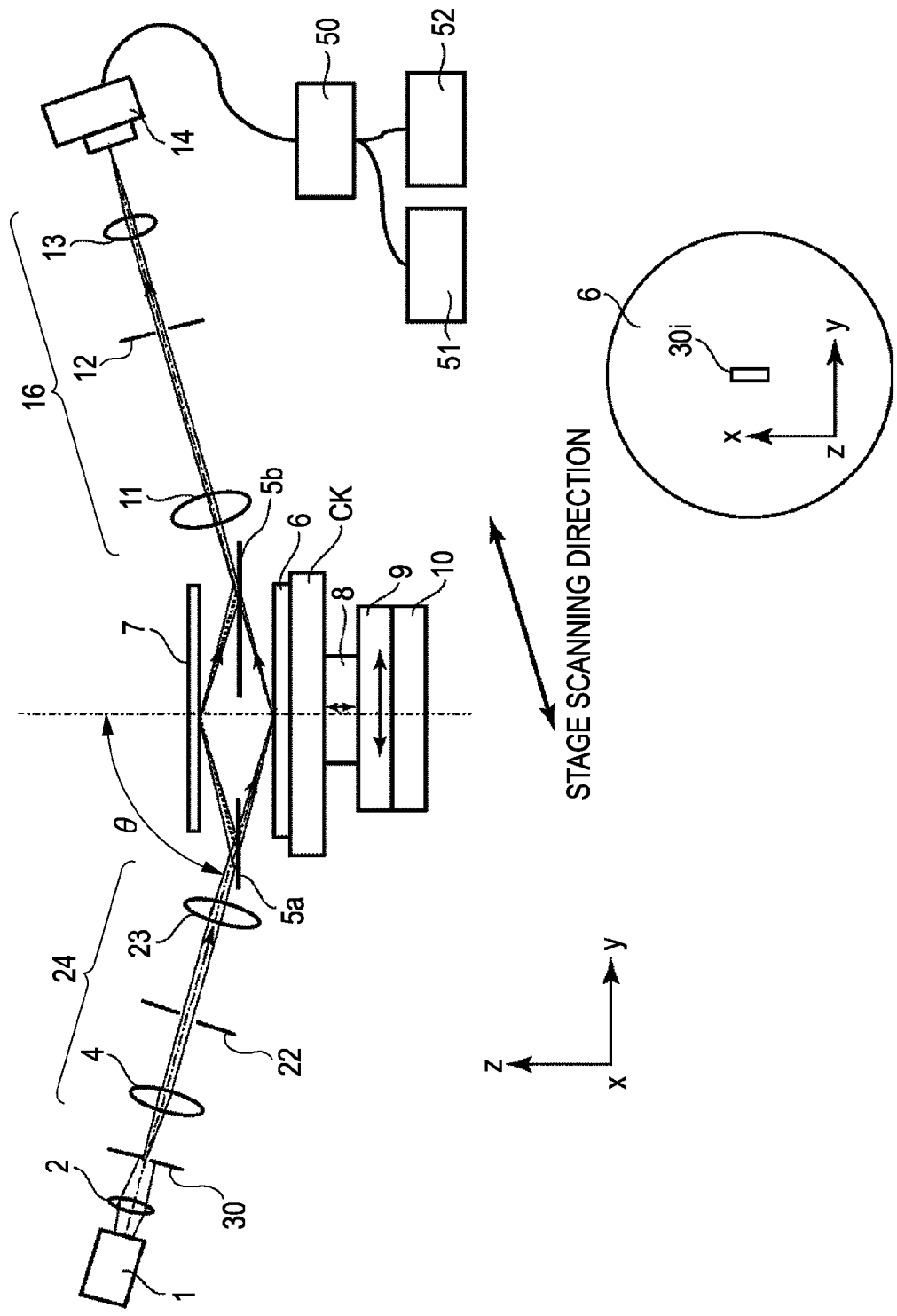
FIG. 3 is a schematic view illustrating an example shape measuring apparatus according to a second exemplary embodiment of the present invention.

A shape measuring apparatus 200 according to a second exemplary embodiment of the present invention will be described in detail next. FIG. 3 is a schematic view illustrating the shape measuring apparatus 200 according to another aspect (second exemplary embodiment) of the present invention.

The shape measuring apparatus 200 according to the second exemplary embodiment is constituted by a light sending optical system, a stage system, a light receiving optical system, and a data processing system. The light sending optical system includes a light source 1 and a condenser lens 2. The light sending optical system further includes a slit plate 30, an imaging optical system 24 made up of lenses 4 and 23, an aperture stop 22, and a beam splitter 5a.

The stage system is constituted by a substrate chuck CK which holds a substrate 6 as a measurement target, and a driving mechanism including a Z-stage 8, a Y-stage 9, and an X-stage 10.

The light receiving optical system is constituted by a beam splitter 5b, an image pickup element 14, an imaging optical system made up of lenses 11 and 13 arranged to image the surface of the substrate 6 on the image pickup element 14, and an aperture stop 12.

The data processing system is constituted by a processing unit 50, a storage unit 51 storing data, and a display apparatus 52 which displays measured results and measurement conditions.

Detailed functions of the components in the second exemplary embodiment will be described below. In FIG. 3, the light emitted from the light source 1 is condensed onto the slit plate 30 by the condenser lens 2. The slit plate 30 has a rectangular transmittable (slit) area with a slit width of 50 μm and a length of 700 μm in the direction of the X-axis such that a rectangular image is formed by the imaging optical system 24 on each of the substrate 6 and the reference mirror 7. A principal beam of the light having passed through the imaging optical system 24 impinges upon the substrate 6 at an angle θ of incidence. Because the beam splitter 5a is disposed midway a light path downstream of the imaging optical system 24, a light beam having about ½ of total light quantity is reflected by the beam splitter 5a and impinges upon the reference mirror 7 at the same angle θ of incidence as that for the substrate 6.

The light having passed through the beam splitter 5a is illuminated to the substrate 6, and the reflected light from the substrate 6 (hereinafter referred to as "measurement light") enters the beam splitter 5b. On the other hand, the light reflected by the beam splitter 5a is illuminated to the reference mirror 7, and the reflected light from the reference mirror 7 (hereinafter referred to as "reference light") enters the beam splitter 5b. Because the light source 1, the polarization state of the light, the angle θ of incidence, the beam splitters, the reference mirror, etc. are the same as those in the first exemplary embodiment, a detailed description of those components is not repeated here.

The measurement light reflected by the substrate 6 and the reference light reflected by the reference mirror 7 are combined with each other by the beam splitter 5b and are both detected by the image pickup element 14. The beam splitter 5b can be formed of the same one as the beam splitter 5a. Midway a path of the combined light, the lenses 11 and 13 and the aperture stop 12 are disposed to perform the following functions. The lenses 11 and 13 form a both-side telecentric imaging optical system 16 such that the surface of the substrate 6 is imaged on the light receiving surface of the image pickup element 14. In the second exemplary embodiment, therefore, the transmittable area (slit) of the slit plate 30 is imaged on each of the substrate 6 and the reference mirror 7 as the slit image 30i by the imaging optical system 24, and it is further imaged again on the image pickup element 14 by the imaging optical system 16.

The aperture stop 12 disposed at the pupil position of the imaging optical system 16 serves to specify the numerical aperture (NA) of the imaging optical system 16 such that the NA is set to a very small value in the range of sin (0.5°) to sin (5°). On the light receiving surface of the image pickup element 14, the measurement light and the reference light are overlapped with each other to cause interference of both the lights.

A method of obtaining an interference signal and a method of processing the interference signal can be performed similarly to the methods described above in the first exemplary embodiment, and therefore a description of those methods is not repeated here.

According to the second exemplary embodiment, since the light is concentrated to the transmittable slit area of the slit plate 30, a higher density of the light intensity can be obtained and the shape measurement can be performed at a higher S/N ratio than those in the first exemplary embodiment. Although the second exemplary embodiment is disadvantageous in that a measurable area per light beam is limited to the transmittable slit area and is narrower than that in the first exemplary embodiment, the second exemplary embodiment is effective when the measurement points on the substrate 6 each have a relatively small area and are arranged in a discrete pattern. When measuring shapes of plural areas on the substrate 6, the operations of obtaining and processing the interference signal are performed, as in the first exemplary embodiment, after driving the X-stage and the Y-stage so as to align the transmittable slit area with a desired position on the substrate 6.

Third Exemplary Embodiment

Figure 4:
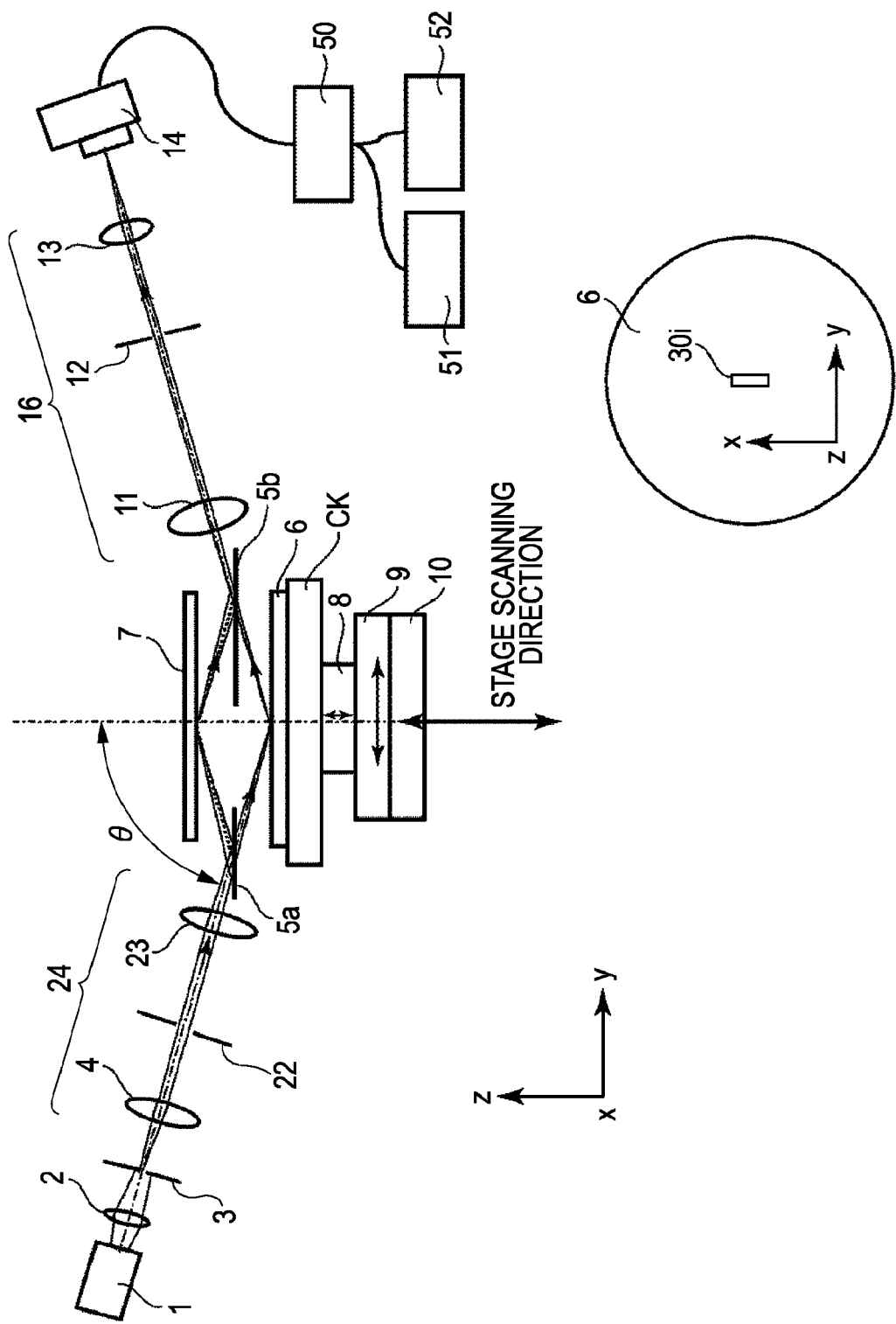
FIG. 4 is a schematic view illustrating an example shape measuring apparatus according to a third exemplary embodiment of the present invention.

A shape measuring apparatus 200 according to a third exemplary embodiment of the present invention will be described in detail next. FIG. 4 is a schematic view illustrating the shape measuring apparatus 200 according to still another aspect (third exemplary embodiment) of the present invention.

Because the construction of the shape measuring apparatus 200 according to the third exemplary embodiment is similar as that in the second exemplary embodiment, a description thereof is not repeated here. In the first and second exemplary embodiments, when the interference signal is obtained, the Z-stage and the Y-stage are driven to move the substrate 6 parallel to the direction in which the light is reflected by the substrate 6. On the other hand, in the third exemplary embodiment, only the Z-stage is driven (i.e., the substrate chuck CK is moved perpendicularly to the surface of the substrate 6) when the interference signal is obtained.

Figure 5A:
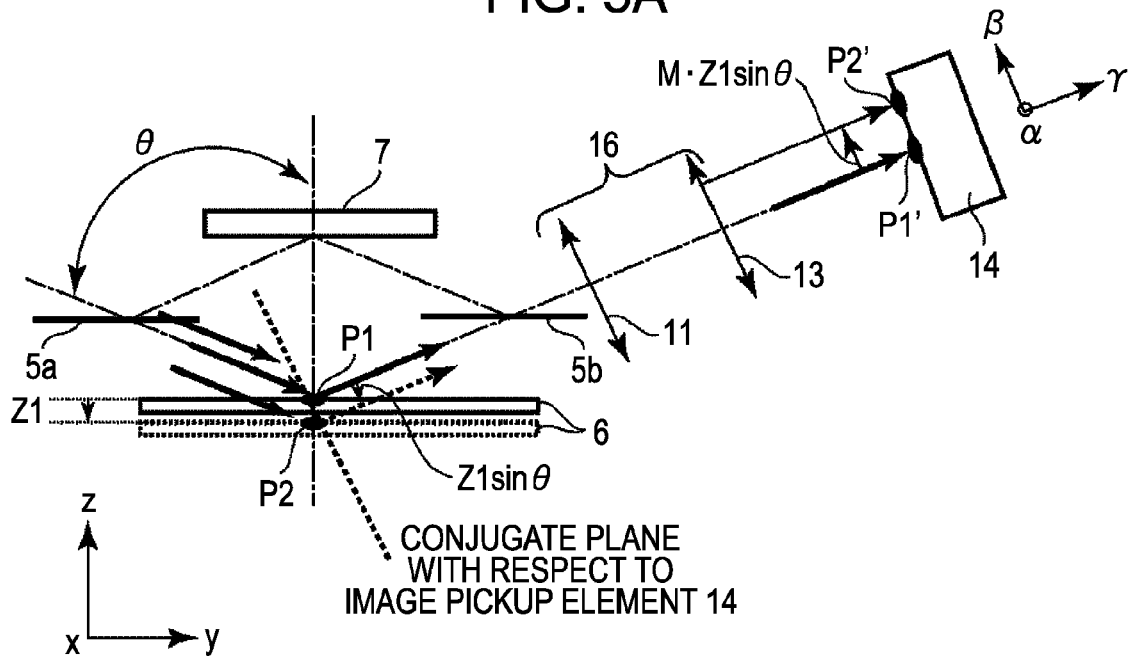
FIG. 5A is a partial enlarged view of the shape measuring apparatus according to the third exemplary embodiment of the present invention.

FIG. 5A illustrates, in an enlarged scale, a part of the shape measuring apparatus of FIG. 4. An angle of incidence of the light upon the substrate 6 is assumed to be θ. Looking at a measurement point P on the substrate 6, by way of example, the reflected light from the measurement point P (which takes P1 at an initial position and P2 after the driving in the Z-direction) is shifted through a distance $Z1 \sin θ$ when the Z-stage is driven through a distance Z1. On the light receiving surface of the image pickup element 14 (on which P1' represents an image position of the measurement point P1 at the initial position and P2' represents an image position of the measurement point P2 after the driving in the Z-direction), the reflected light is shifted through a distance M·Z1 sin θ that is resulted from multiplying the above shift by a magnification M of the imaging optical system 16. Therefore, the locus of the measurement point image on the image pickup element 14, which is moved depending on the driving of the Z-stage, can be determined by using the angle θ of incidence and the magnification M of the imaging optical system 16. In other words, by successively shifting a pixel selected to generate the white interference signal in accordance with the driving of the Z-stage through the distance Z1, the white interference signal can be always obtained from the same measurement point P on the surface of the substrate 6. FIG. 7B illustrates images on the light receiving surface of the image pickup element 14. As shown in FIG. 7B, a slit image 30r of the reference light and a slit image 30m of the measurement light are substantially fully overlapped with each other on the image pickup element 14 and an image P' of the measurement point P is present in the slit image 30m. Also, as shown in FIG. 7B, when the substrate 6 is moved in the Z-direction, the image P' of the measurement point P is moved in a direction β together with the slit image 30m. On the other hand, the slit image 30r of the reference light is kept immobile.

FIG. 7A is a chart plotting the white interference signal obtained with the third exemplary embodiment. In the third exemplary embodiment, the white interference signal plotted in FIG. 7A is obtained by successively taking in signals from plural pixels covered by the measurement point image P', shown in FIG. 7B, in sync with the movement of the substrate 6 in the Z-direction. More specifically, the light intensity is successively taken in for each of the pixels at position shifted in the direction β through the distance M·Zp sin θ with respect to the sampling pitch Zp in the Z-axis direction. As a result, in spite of the optical arrangement in which the measurement light is caused to obliquely impinge upon the surface of the substrate 6 as the measurement target, the white interference signal can be obtained from the same measurement point on the substrate 6. In the third exemplary embodiment, an amount of displacement of the measurement point on the image pickup element 14 corresponding to the sampling pitch Zp in the Z-axis direction is set to be matched with a pixel pitch Gp of the image pickup element 14 in the direction β. Stated another way, the pixel pitch Gp, the magnification M of the imaging optical system 16, the angle θ of incidence, and the sampling pitch Zp in the Z-axis direction are determined so as to satisfy the relationship of Gp=|M|·Zp sin θ. Taking exemplary numerical values, the image pickup element 14 used has the pixel pitch Gp=4 μm, the angle θ of incidence is 80 degrees, the magnification M of the imaging optical system 16 is −40, and the sampling pitch Zp in the Z-axis direction is 102 nm. As described above in the first exemplary embodiment, it is more advantageous from the viewpoint of a throughput to drive the Z-stage at a constant speed and to take in the measured value of the Z-axis gage interferometer in sync with the sampling to take in the image by the image pickup element 14. In such a case, assuming that the sampling cycle to take in the image by the image pickup element 14 is 10 msec, the image is taken in while driving the Z-stage at a constant speed of 102 nm/10 msec=10 μm/sec. Further, per sampling, the brightness (light intensity) at each pixel shifted through a distance corresponding to one pixel in the direction β is stored in the storage unit in correlation to the measured value of the Z-axis gage interferometer. Since a processing method after obtaining the white interference signal can be performed similarly to that in the first exemplary embodiment, a description thereof is not repeated here.

Figure 5B:
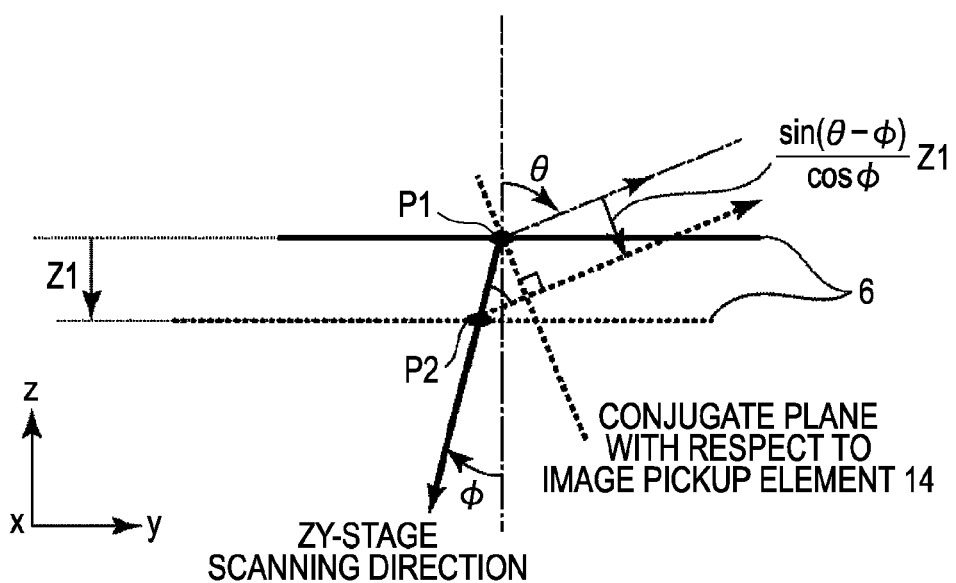
FIG. 5B is a partial enlarged view of the shape measuring apparatus as a modification of the third exemplary embodiment of the present invention.

In the third exemplary embodiment, the stage scanning direction is not limited to the Z-direction and the stage can also be scanned in a direction inclined by ϕ from the Z-axis. Such a modified example will be described with reference to FIGS. 5A and 5B. FIG. 5B illustrates, in an enlarged scale, a part of the substrate 6 shown in FIG. 5A. It is here assumed that the light is reflected from the substrate 6 in a direction at an angle θ (which is equal to the angle θ of incidence of the light upon the substrate 6) and the substrate 6 is scanned in a direction denoted by an arrow in FIG. 5B by using the Z-stage and the Y-stage. Looking at the measurement point P on the substrate 6, when the Z-stage is driven through the distance Z1, the reflected light from the same measurement point P on the substrate 6 is shifted from the initial position through a distance Z1·sin(θ−ϕ)/cos ϕ. On the light receiving surface of the image pickup element 14, therefore, the reflected light is shifted through a distance M·Z1·sin(θ−ϕ)/cos ϕ that is resulted from multiplying the above distance by the magnification M of the imaging optical system 16. Thus, the locus of the measurement point image on the image pickup element 14, which is moved depending on the driving of the Z-stage and the Y-stage, can be determined by using the angle θ of incidence, the magnification M of the imaging optical system 16, and the scanning direction ϕ. In other words, by successively shifting a pixel selected to generate the white interference signal in accordance with the driving of the Z-stage through the distance Z1, the white interference signal can be always obtained from the same measurement point P on the surface of the substrate 6.

Fourth Exemplary Embodiment

Figure 8:
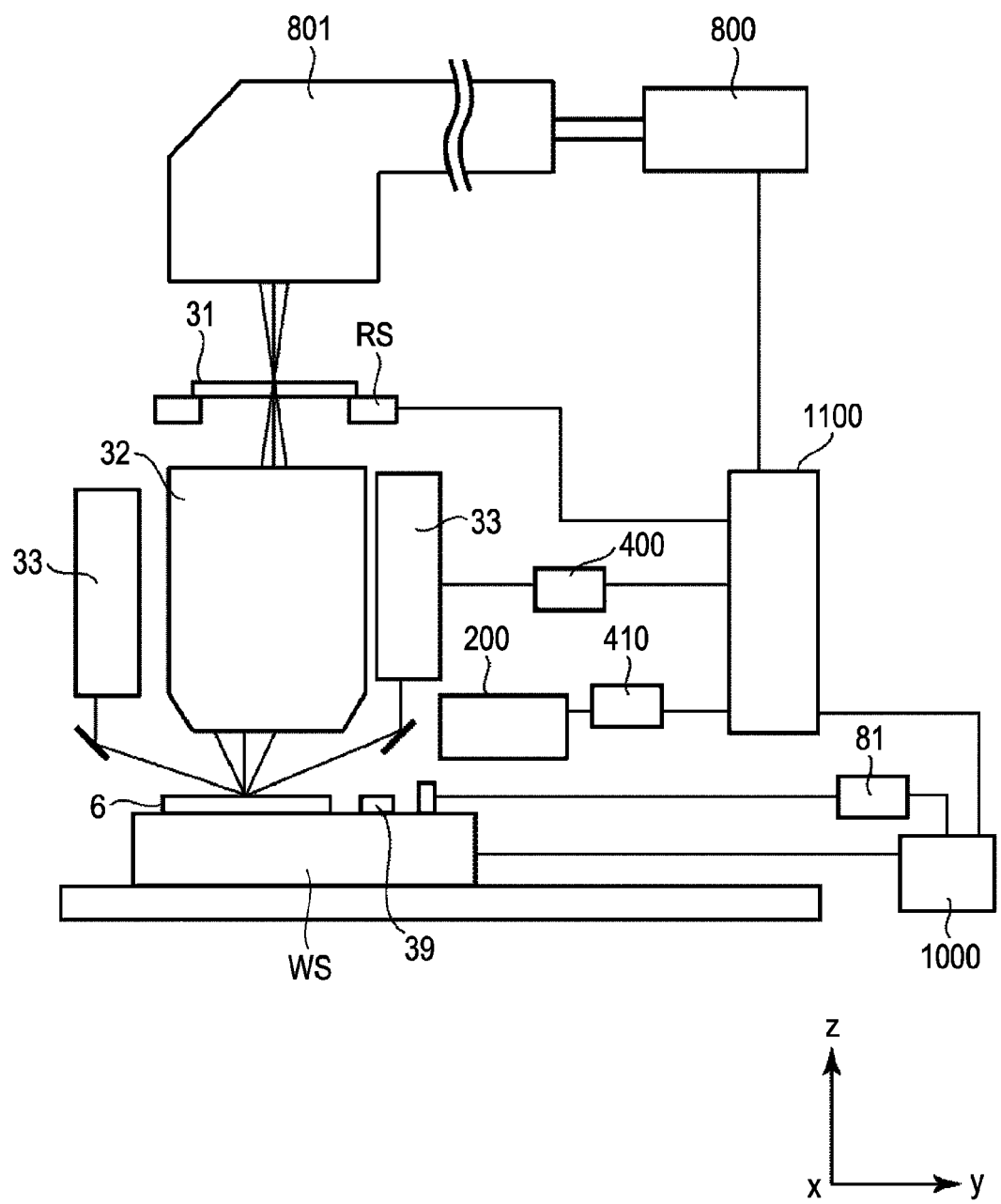
FIG. 8 is a block diagram illustrating an exposure apparatus according to a fourth exemplary embodiment of the present invention.

FIG. 8 is a block diagram illustrating an exposure apparatus including a shape measuring apparatus according to a fourth exemplary embodiment of the present invention. The exposure apparatus according to the fourth exemplary embodiment includes an illumination apparatus 800-801, a reticle stage RS on which a reticle (mask) 31 is placed, a projection optical system 32, a wafer stage WS on which a wafer (substrate) 6 is placed, a focus control sensor 33, and a shape measuring apparatus 200. A reference plate 39 is also disposed on the wafer stage WS. The exposure apparatus further comprises a processing unit 400 for the focus control sensor 33 and a processing unit 410 for the shape measuring apparatus 200.

The shape measuring apparatus 200 can be constituted as one according to any of the first to third exemplary embodiments. While the focus control sensor 33 and the shape measuring apparatus 200 each have a function of measuring a shape of the wafer 6, they have the following specific features. The focus control sensor 33 is a sensor which has a quicker response, but it is more affected by a wafer pattern. The shape measuring apparatus 200 is a sensor which has a slower response, but it is less affected by the wafer pattern.

A control unit 1100 includes a CPU and a memory. The control unit 1100 is electrically connected to the illumination apparatus 800-801, the reticle stage RS, the wafer stage WS, the focus control sensor 33, and the shape measuring apparatus 200, thus controlling the operation of the exposure apparatus. In the fourth exemplary embodiment, the control unit 1100 also executes corrective calculations of measured values and necessary control when the focus control sensor 33 detects a surface position of the wafer 6. Reference numeral 1000 denotes a wafer stage (WS) control unit which has a function of controlling a driving profile of the wafer stage WS in accordance with a command from the control unit 1100.

The illumination apparatus 800-801 includes a light source unit 800 and an illumination optical system 801 arranged to illuminate the reticle 31 on which a circuit pattern to be transferred is formed.

The light source unit 800 is constituted by, e.g., a laser. The laser can be, for example, an ArF excimer laser with a wavelength of about 193 nm or a KrF excimer laser with a wavelength of about 248 nm. The usable type of the light source is not limited to the excimer laser. As other examples, a F2 laser with a wavelength of about 157 nm and EUV (Extreme Ultraviolet) light with a wavelength of not longer than 20 nm can also be used.

The illumination optical system 801 is an optical system arranged to illuminate a target surface by using a light beam emitted from the light source unit 800. In the fourth exemplary embodiment, the light beam is shaped by an exposure slit having a predetermined shape optimum for exposure and is illuminated to the reticle 31.

The reticle 31 is an original on which the circuit pattern to be transferred is formed, and it is supported on and driven by the reticle stage RS. Diffracted light from the reticle 31 passes through the projection optical system 32 and is projected onto the wafer 6. The reticle 31 and the wafer 6 are arranged in an optically conjugate relation. The circuit pattern on the reticle 31 is transferred to the wafer 6 by scanning the reticle 31 and the wafer 6 at a speed ratio corresponding to a reduction factor ratio. In addition, the exposure apparatus includes, though no shown, a reticle detecting unit having a light oblique incidence system. A reticle position is detected by the reticle detecting unit such that the retile 31 is placed at a predetermined position.

The reticle stage RS supports the reticle 31 through a reticle chuck (not shown) and is connected to a driving mechanism (not shown). The driving mechanism is constituted by linear motors, etc. and is able to drive the reticle stage RS in the X-axis direction, the Y-axis direction, the Z-axis direction, and the rotating direction about each axis, thereby moving the reticle 31 to the desired position.

The projection optical system 32 has a function of focusing a light beam from a target surface on an image plane. In the fourth exemplary embodiment, the projection optical system 32 images the circuit pattern formed on the reticle 31 onto the wafer 6. The projection optical system 32 is constituted by a refractive system, a catadioptic system, or a reflective system.

A resist serving as a photosensitizer is coated on the wafer 6. In the fourth exemplary embodiment, the wafer 6 is a target to be measured by the focus control sensor 33 and the shape measuring apparatus 200. While the wafer 6 is used as the substrate in this exemplary embodiment, a glass plate can also be used instead.

The wafer stage WS supports the wafer 6 by a wafer chuck (not shown). As with the reticle stage RS, the wafer stage WS can move the wafer 6 in the X-axis direction, the Y-axis direction, the Z-axis direction, and the rotating direction about each axis by using linear motors. The position of the reticle stage RS and the position of the wafer stage WS are each monitored by a 6-axis laser interferometer 81, etc. such that those two stages are driven at a constant speed ratio.

A point for measuring the surface position (focus) of the wafer 6 will be described next. In the fourth exemplary embodiment, the wafer surface shape is measured by the focus control sensor 33 while scanning the wafer stage WS in the scanning direction (Y-direction) so as to cover an entire width of the wafer 6. Further, after stepping the wafer stage WS through a distance ΔX in a direction perpendicular to the scanning direction (i.e., in the X-direction), the operation of measuring the wafer surface position is repeated in the scanning direction. As a result, profiling of the entire surface of the wafer 6 is performed. For the purpose of increasing a throughput, the surface positions of the wafer 6 at different points thereon can also be measured at the same time by using a plurality of focus control sensors 33.

The focus control sensor 33 employs an optical height measuring system. In other words, the focus control sensor 33 utilizes a method of introducing the light to impinge upon the wafer surface at a large angle of incidence and detecting an image shift of the reflected light by using a position detecting element such as a CCD sensor. In particular, light beams are caused to impinge upon a plurality of points to be measured on the wafer, and respective reflected light beams are introduced to individual sensors. A tilt of the surface to be exposed is calculated from height information measured at different positions.

Figure 9:
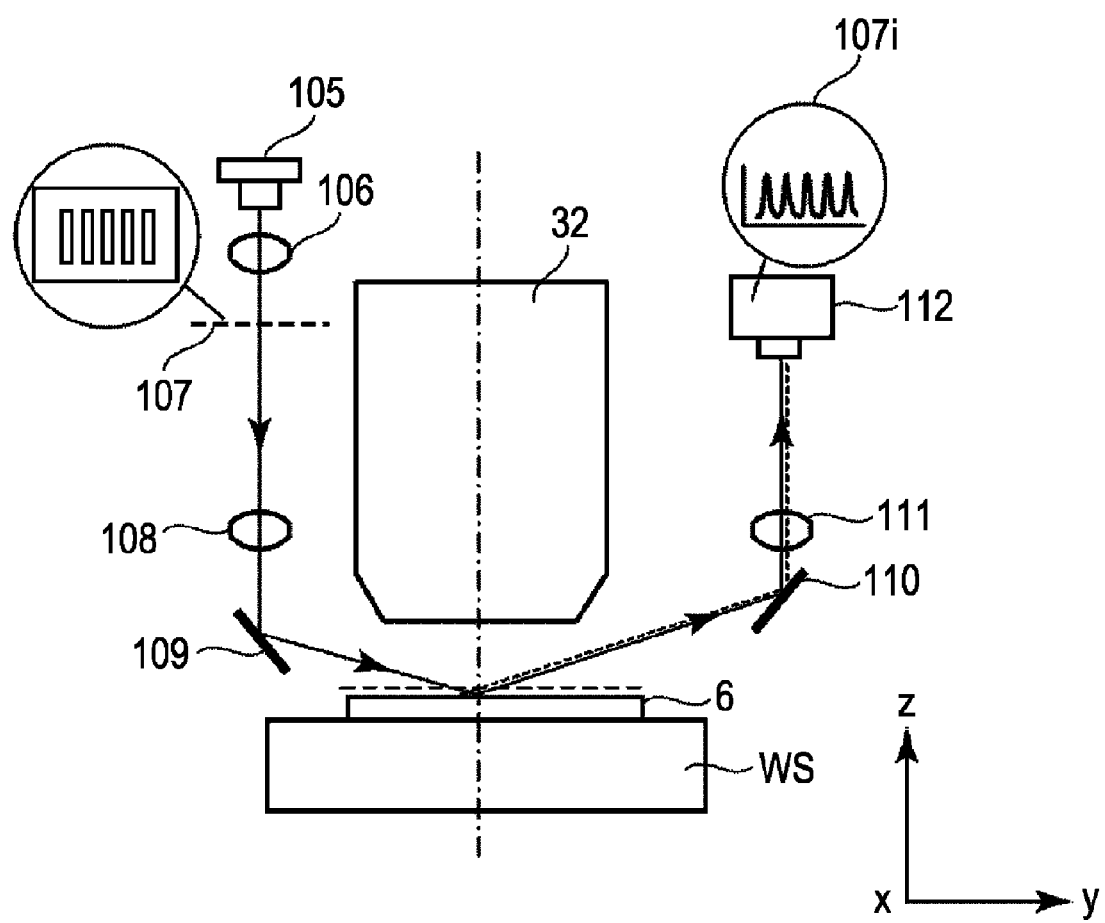
FIG. 9 is a schematic view illustrating a focus control sensor (surface position measuring apparatus) in the fourth exemplary embodiment of the present invention.
Figure 10:
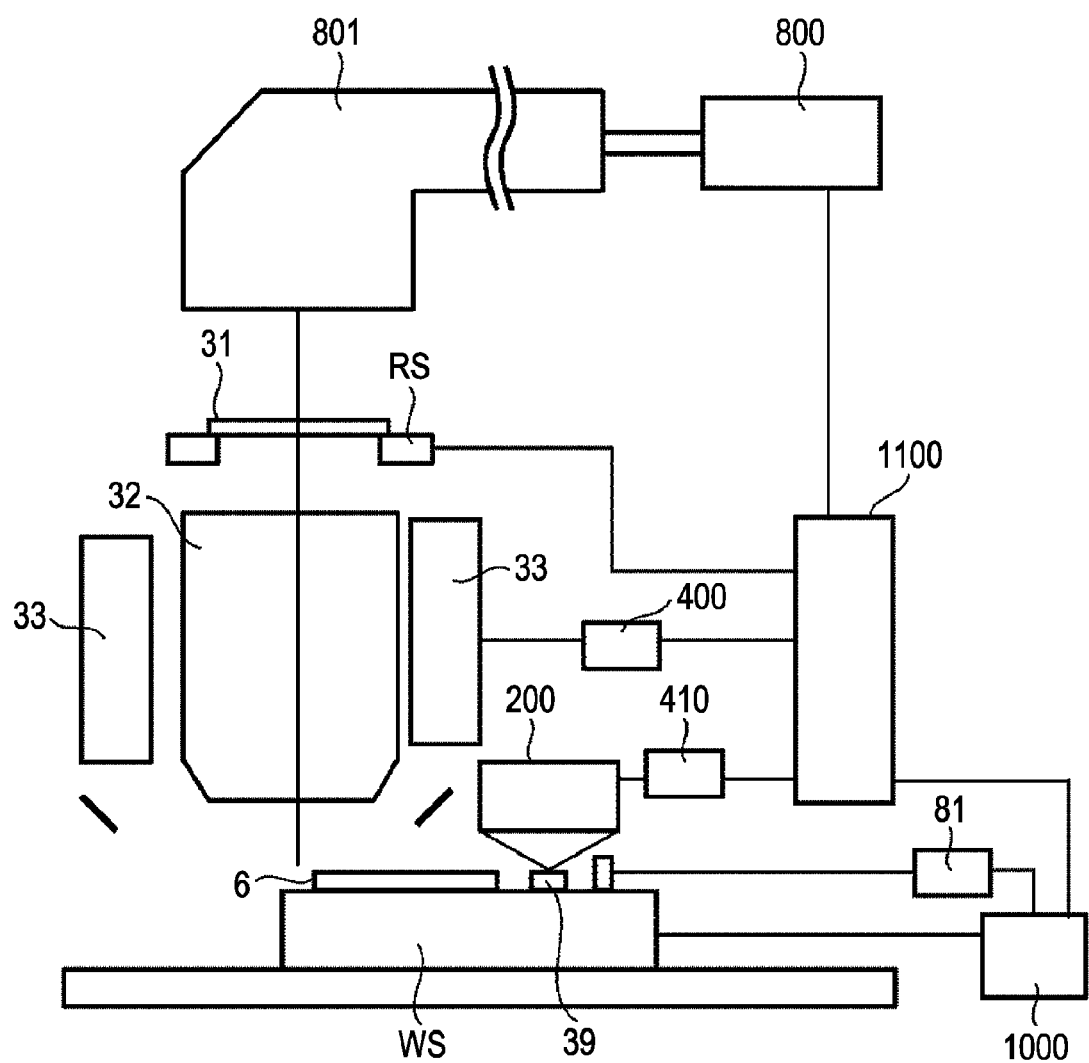
FIG. 10 is a block diagram illustrating a calibration method in the fourth exemplary embodiment of the present invention.

Detection of the focus and the tilt will be described in detail next. A description is first given of the construction and the operation of the focus control sensor 33. Referring to FIG. 9, a detection system includes a light source 105, a condenser lens 106, a pattern plate 107 having a plurality of rectangular transmittable slits formed therein side by side, lenses 108 and 111, a wafer 6, a wafer stage WS, mirrors 109 and 110, and a photo detector such as a CCD sensor. Reference numeral 32 denotes a reduction projection lens arranged to project a reticle (not shown) onto the wafer 6 for exposure. Light emitted from the light source 105 is condensed by the condenser lens 106 and is illuminated to the pattern plate 107. The light having passed through the slits of the pattern plate 107 is illuminated to the wafer 6 at a predetermined angle through the lens 108 and the mirror 109. The pattern plate 107 and the wafer 6 are arranged in an imaging relation with respect to the lens 108 such that an aerial image of each slit of the pattern plate 107 is formed on the wafer 6. The reflected light from the wafer 6 is received by the CCD sensor 112 through the mirror 110 and the lens 111. The slit image on the wafer 6 is focused again onto the CCD sensor 112 through the lens 111. The CCD sensor 112 produces a signal representing the slit images corresponding to the individual slits of the pattern plate 107, as indicated by 107*i*. The position of the wafer 6 in the Z-direction is measured by detecting a position shift of the produced signal on the CCD sensor 112. When the wafer surface is changed by dZ from a position w1 to w2 in the Z-direction, a shift amount m1 of an optical axis on the wafer 6 can be expressed by the following formula on the assumption that the angle of incidence is θin:

$$m1 = 2 \cdot dZ \cdot \tan \theta in \quad (1)$$

Assuming the angle θin of incidence to be 84 degrees, for example, m1=19×dZ is resulted. This means that the amount of displacement of the optical axis is magnified 19 times the displacement of the wafer. The mount of displacement on the photo detector is obtained by multiplying m1 in the formula (1) by the magnification of the optical system (i.e., the imaging magnification by the lens 111).

Figure 11:
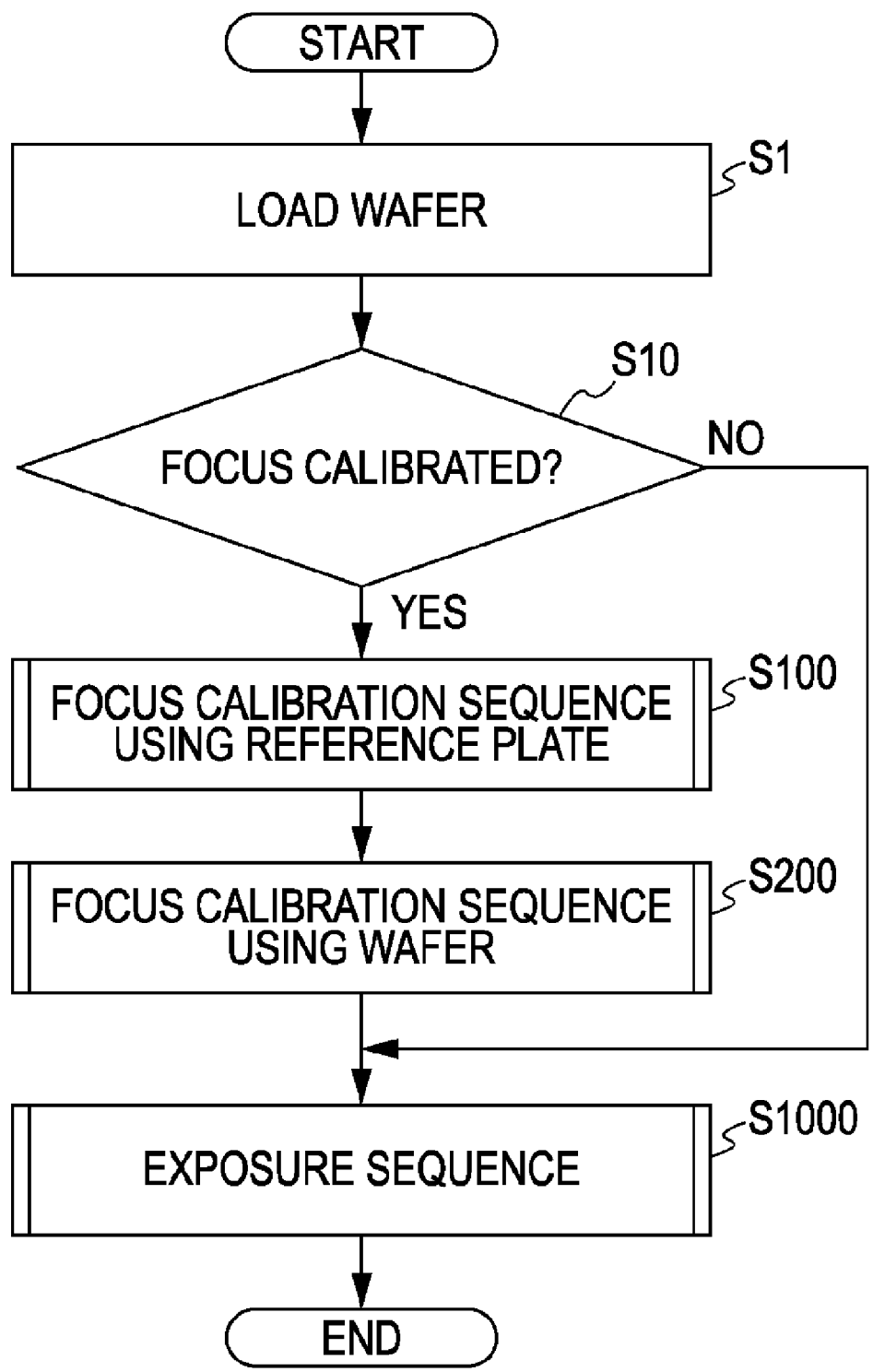
FIG. 11 is a flowchart of an exposure sequence in the fourth exemplary embodiment of the present invention.

An exposure method using the above-described exposure apparatus according to the fourth exemplary embodiment will be described in detail next. FIG. 11 is a flowchart illustrating an overall sequence of the exposure method used in the exposure apparatus according to the fourth exemplary embodiment. First, in step S1, the wafer 6 is loaded into the exposure apparatus. Then, it is determined in step S10 whether focus calibration is to be performed on the wafer 6 by using the focus control sensor 33. Such determination is automatically made based on information regarding, e.g., "whether the target wafer is one at the head in a lot, or it is one in a head lot of plural lots, or it is one that is subjected to a process which requires a severe level of focus accuracy". That information has been previously registered by the user in the exposure apparatus. If it is determined in step S10 that the focus calibration is not required, the processing is advanced to step S1000 in which an ordinary exposure sequence is executed on the wafer. On the other hand, if it is determined in step S10 that the focus calibration is required, the processing is advanced to step S100 in which a focus calibration sequence is executed.

Figure 12:
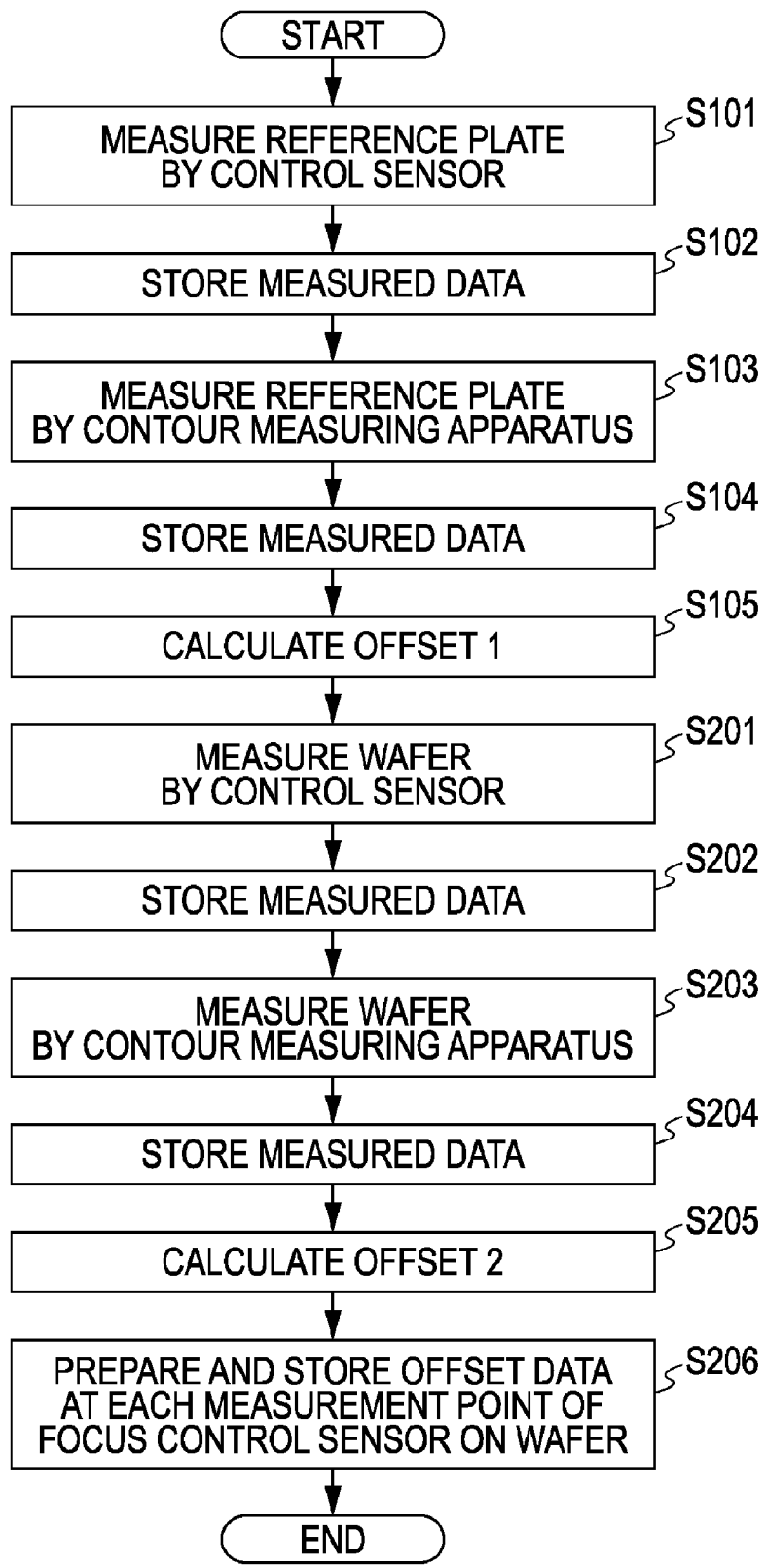
FIG. 12 is a flowchart of the calibration method in the fourth exemplary embodiment of the present invention.

In step S100, a flowchart shown in FIG. 12 is executed. First, the wafer stage WS is driven such that the reference plate 39 is precisely positioned under the focus control sensor 33. The reference plate 39 is made of, e.g., a glass plate having superior surface accuracy, which is called an optical flat. The surface of the reference plate 39 has an area having uniform reflectivity, i.e., having no distribution of reflectivity, so as to prevent an error generated in the measurement by the focus control sensor 33. The measurement is performed using such an area having uniform reflectivity. The reference plate 39 can also be formed as a part of a plate which includes various calibration marks used in other calibrations (regarding, e.g., alignment detection and evaluation of the projection optical system) which are required in the exposure apparatus.

Now referring to FIG. 12, in step S101, the position of the reference plate 39 in the Z-direction is detected by the focus control sensor 33. In step S102, a measured value Om is stored in the exposure apparatus. Then, in step S103, the wafer stage WS is driven such that the reference plate 39 is precisely positioned under the shape measuring apparatus 200. Thereafter, a reference plate shape in the same measurement area (within an XY-plane) as that measured by the focus control sensor 33 is measured by the shape measuring apparatus 200. In step S104, measured shape data Pm is stored in the exposure apparatus. In step S105, a first offset (Offset 1) is calculated.

Figure 14:
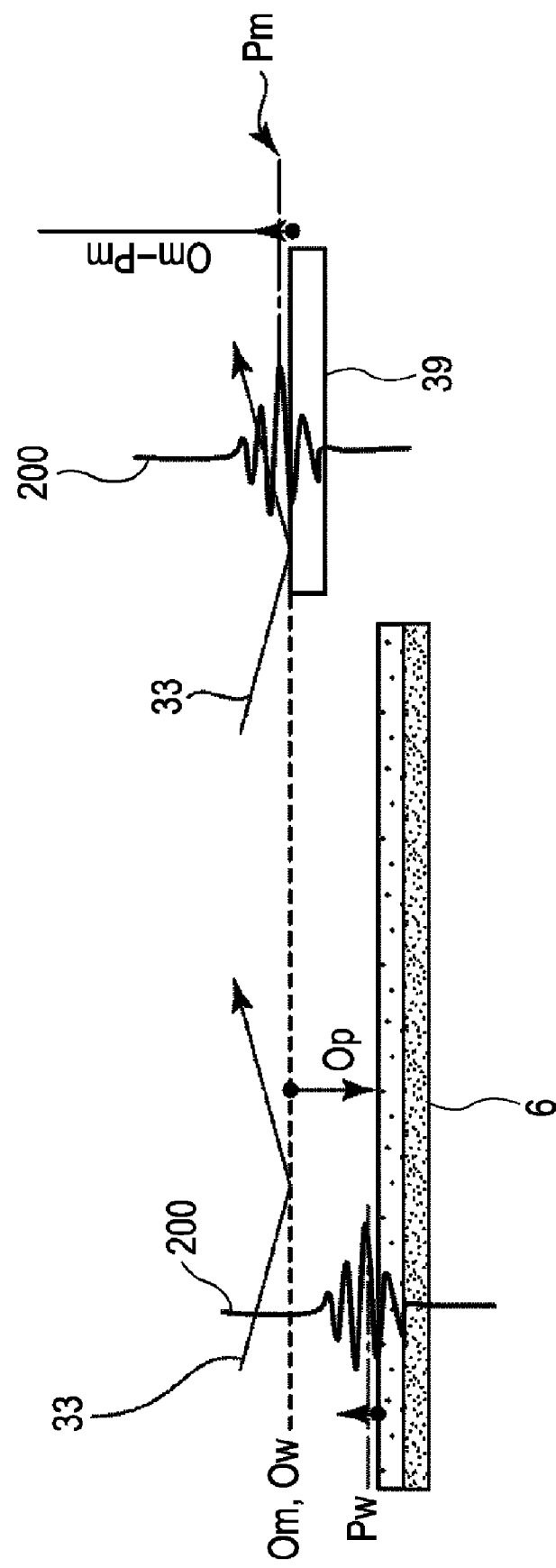
FIG. 14 is an explanatory view illustrating the calibration method in the fourth exemplary embodiment of the present invention.
Figure 15:
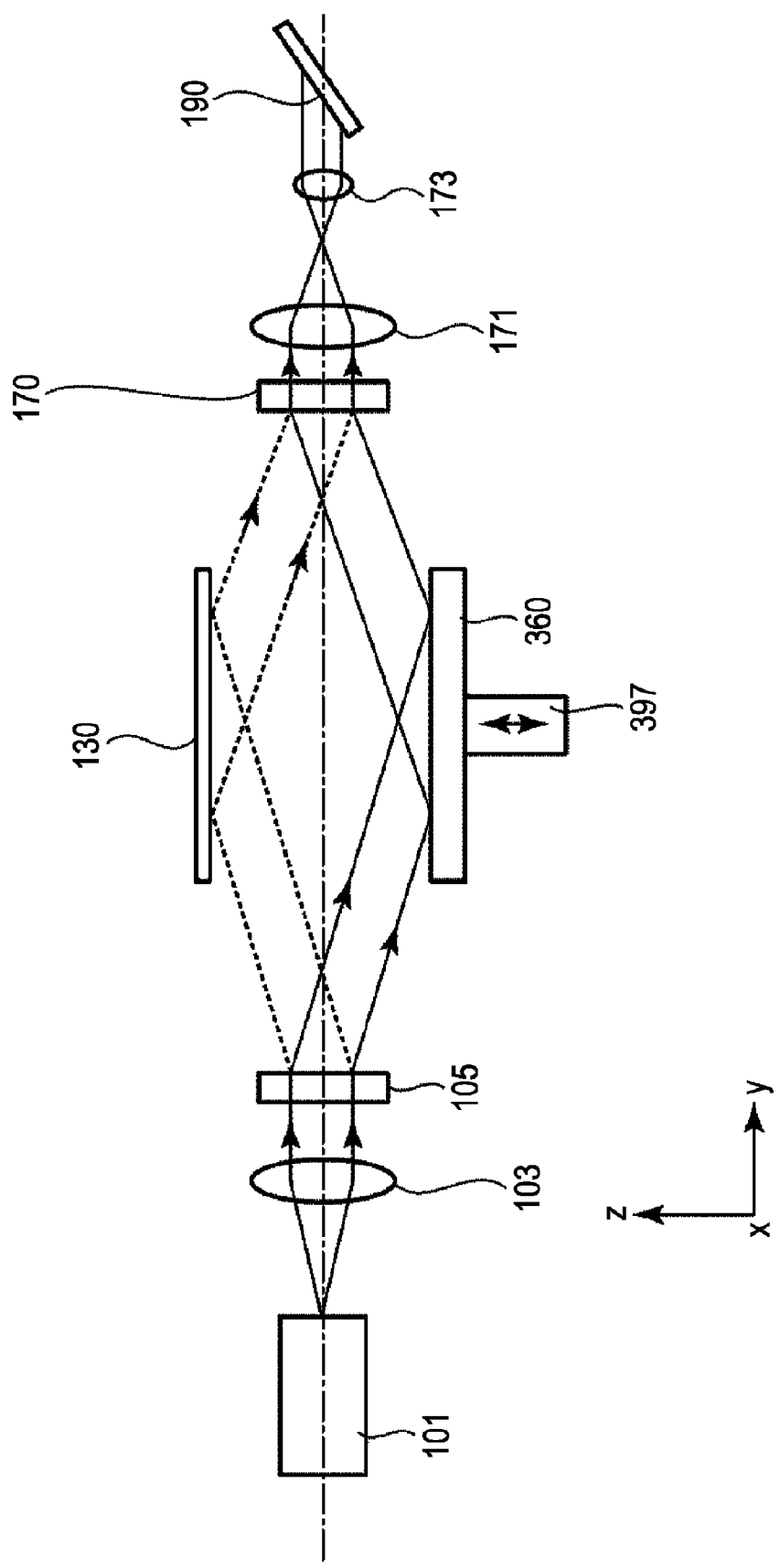
FIG. 15 is a schematic view illustrating a known shape measuring apparatus.
Figure 17A:
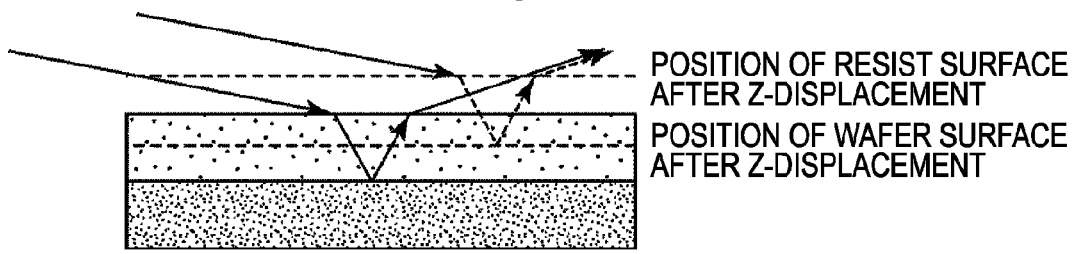
FIG. 17A is a schematic view showing a measurement position in the known shape measuring apparatus when no pattern is formed on a wafer (Case 1).
Figure 17B:
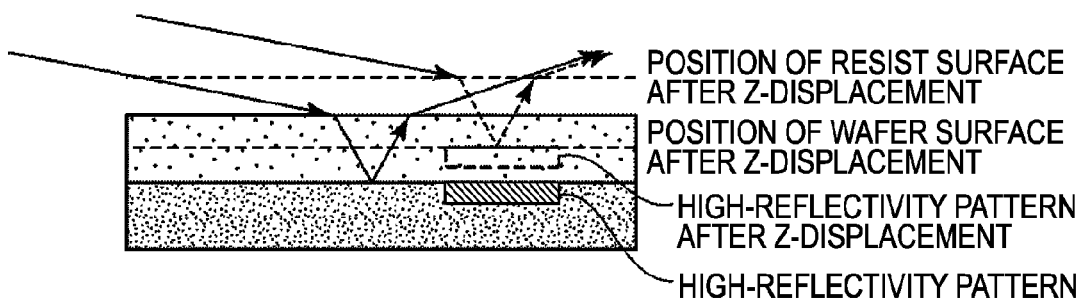
FIG. 17B is a schematic view showing a measurement position in the known shape measuring apparatus when a pattern is formed on the wafer (Case 2).
Figure 18:
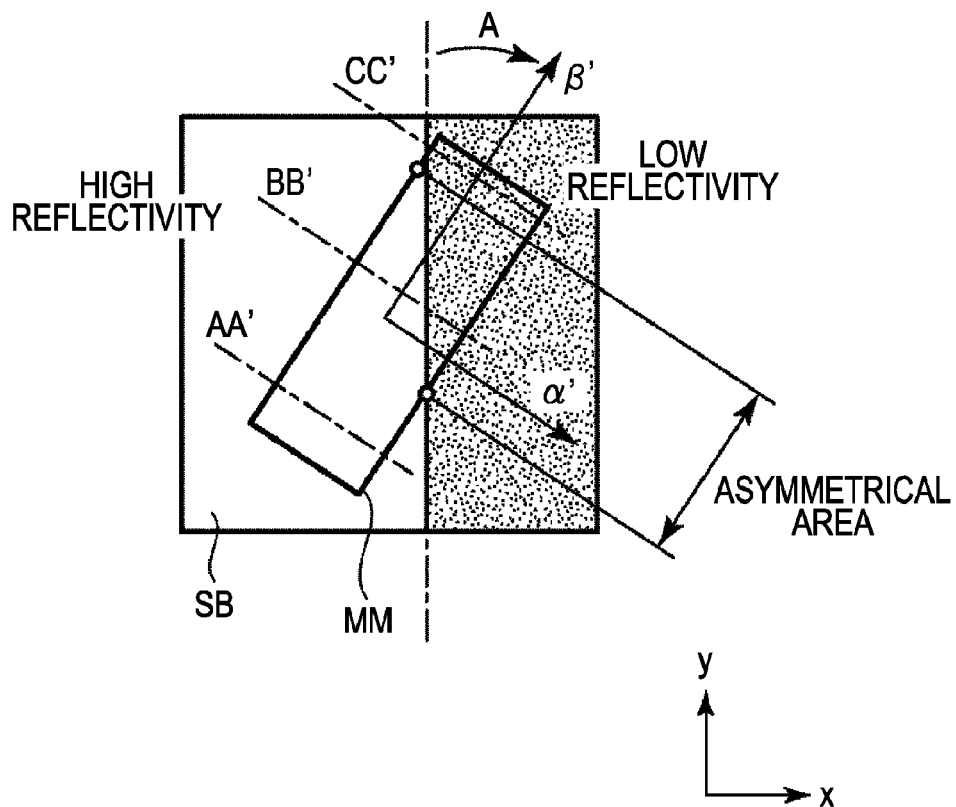
FIG. 18 is an explanatory view illustrating a problem caused in with a known surface position measuring apparatus.
Figure 19:
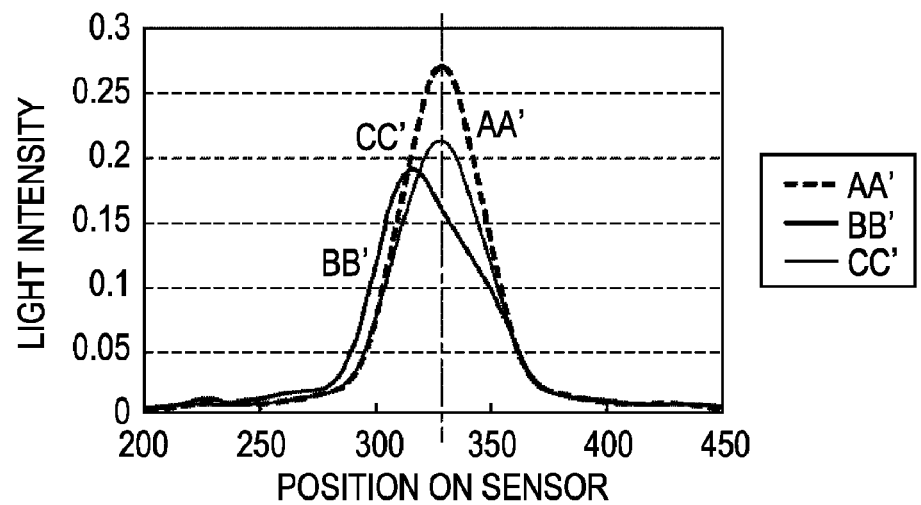
FIG. 19 is a chart plotting an example of a signal profile measured in the known surface position measuring apparatus of FIG. 18.

More specifically, as illustrated in FIG. 14, the Offset 1 is obtained as a difference between the measured value Pm by the shape measuring apparatus 200 and the measured value Om by the focus control sensor 33. The Offset 1 should be zero in an ideal condition because the Offset 1 represents the result of measuring the optically uniform surface of the reference plate 39 and the focus control sensor 33 causes no measurement error. However, error factors can be caused by, e.g., a system-related offset of the wafer stage WS in the scanning direction, and a long-term drift generated in the focus control sensor 33 or the shape measuring apparatus 200. It is therefore desired that the Offset 1 is periodically measured. When those error factors are not substantially generated or can be controlled in a separate manner, the Offset 1 is required to be measured just once. The focus calibration sequence S100 using the reference plate 39 is thereby completed.

Following step S100, a focus calibration sequence S200 for the wafer 6 is executed. In step S201 of FIG. 12, the wafer stage WS is driven to precisely position the wafer 6 at a measurement point Wp by the focus control sensor 33. The measurement point Wp (within the wafer plane) on the wafer 6 is set matched with a measurement point used in the exposure sequence described in detail later. In step S201, a Z-directional position of the measurement point Wp on the wafer 6 is detected by the focus control sensor 33. In step S202, a measured value Ow is stored in the exposure apparatus. Then, in step S203, the wafer stage WS is driven such that the wafer 6 is precisely positioned under the shape measuring apparatus 200. Thereafter, a wafer shape at the measurement point Wp on the wafer 6 is measured by the shape measuring apparatus 200. In step S204, measured shape data Pw is stored in the exposure apparatus. The measurement point Wp on the wafer 6 can be selected from various modes including modes setting one point within the wafer, one point within one shot, all points within one shot, all points within plural shots, and all points within the wafer.

In step S205, a second offset (Offset 2) is calculated. More specifically, as illustrated in FIG. 14, the Offset 2 is obtained as a difference between the measured value Pw by the shape measuring apparatus 200 and the measured value Ow by the focus control sensor 33 per the measurement point Wp on the wafer 6.

In step S206, a difference between the Offset 2 and the Offset 1 is obtained per the measurement point on the wafer, and resulting data is stored in the exposure apparatus. An offset amount Op at each measurement point on the wafer 6 can be calculated from the following formula;

$$Op(i) = [Ow(i) - Pw(i)] - (Om - Pm) \qquad (2)$$

wherein i represents a point number indicating the measurement point on the wafer 6.

As the offset amount Op, an average height offset (Z) and average tilt offsets ($\omega z$, $\omega y$) can also be stored in units of an exposure shot (in the case of a stepper) or in units of an exposure slit (in the case of a scanner). Further, since the circuit pattern on the wafer is formed repetitively per shot (die), the offset amount Op can be obtained and stored as an average value for each shot on the wafer. The focus calibration sequence S200 for the wafer 6 is thereby completed.

Figure 13:
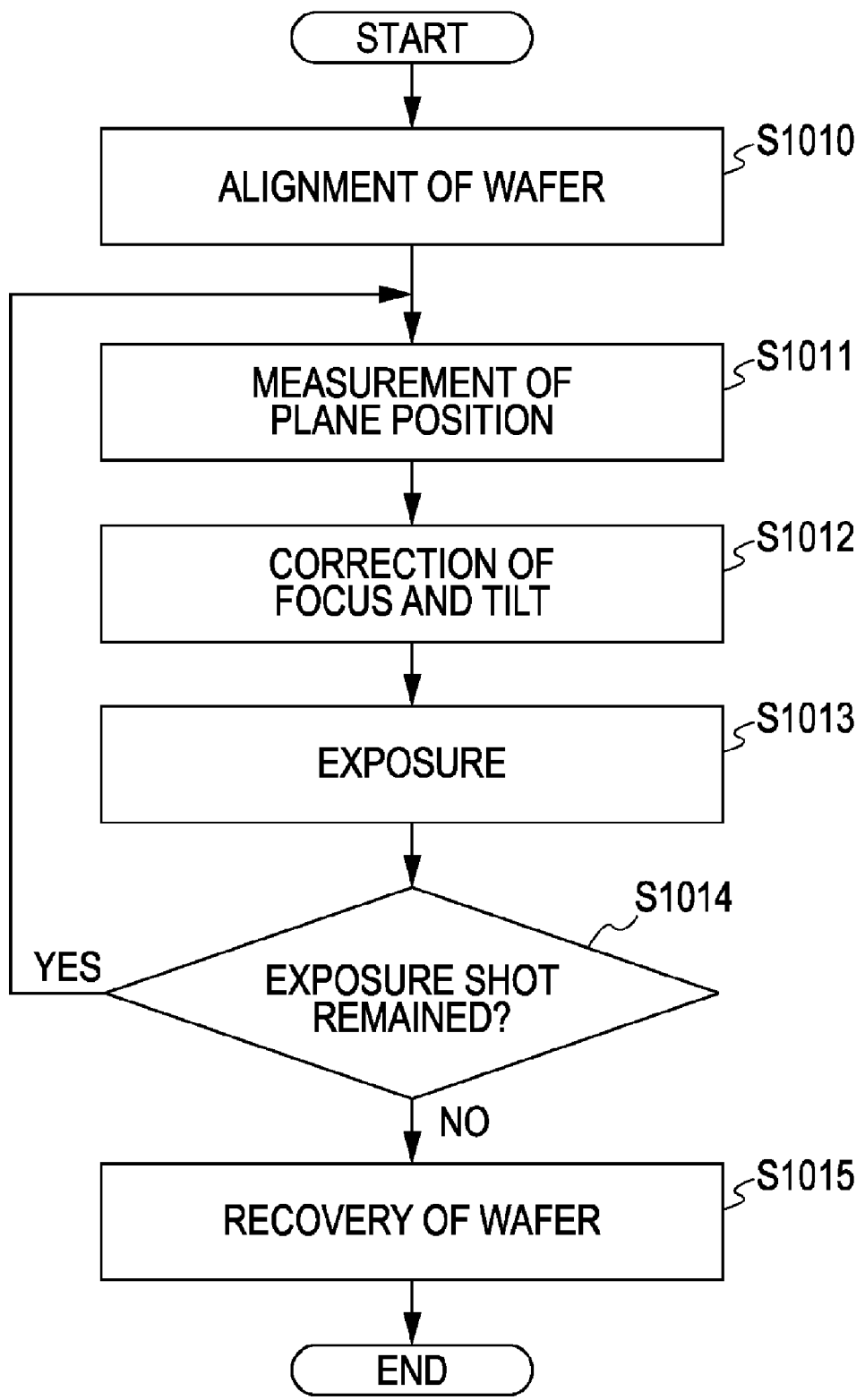
FIG. 13 is a flowchart of an exposure method in the fourth exemplary embodiment of the present invention.

A description is now given of the exposure sequence S1000 that is executed after the end of the calibration sequences S100 and S200. FIG. 13 illustrates details of the exposure sequence S1000.

Referring to FIG. 13, wafer alignment is performed in step S1010. The wafer alignment is performed through the steps of detecting the position of a mark on the wafer by using an alignment scope (not shown) and positioning the wafer on the XY-plane relative to the exposure apparatus. Then, in step S1011, the surface position of the wafer 6 in a predetermined area thereon is measured by using the focus control sensor 33. Such a predetermined area includes the measurement points used in the above-described calibration sequence for the wafer 6. Thus, the shape of the overall wafer surface is measured by correcting the measured values based on the offset amount Op(i) according to the formula (2). Wafer surface shape data having been corrected in such a way is stored in the exposure apparatus.

In step S1012, the wafer 6 is moved by the wafer stage WS from the position under the focus control sensor 33 such that a first exposure shot on the wafer 6 is located at an exposure position under the projection lens 32. At the same time, the processing unit for the exposure apparatus prepares surface shape data for the first exposure shot based on the surface shape data of the wafer 6 and performs correction by driving the stages in the Z-direction and the tilt direction so that a shift amount of the surface of the wafer 6 relative to the plane of an exposed image is minimized. The operation of registering the wafer surface with the plane of the exposed image is thus performed substantially in units of the exposure slit.

In step S1013, the exposure is executed and the wafer stage WS is scanned in the Y-direction. After the exposure for the first shot is completed, it is determined in step S1014 whether any not-yet-exposed shot remains. If the not-yet-exposed shot remains, the processing is returned to step S1012. Then, surface shape data for a next exposure shot is prepared and the exposure is executed while the operation of registering the wafer surface with the plane of the exposed image in units of the exposure slit is performed by driving the stages in the Z-direction and the tilt direction. It is determined again in S1014 whether any shot to be exposed (i.e., the not-yet-exposed shot) remains. If "yes", the above-described operation is repeated until the not-yet-exposed shot disappears. If the exposure is completed for all the shots, the wafer 6 is recovered in step S1015, whereby the processing is brought to an end.

Thus, in the fourth exemplary embodiment, immediately before the exposure per shot, the surface shape data for the exposure shot is prepared, the shift amount from the plane of the exposed image is calculated, and the amounts by which the wafer stage is to be driven are calculated. As another method, before the exposure of the first shot, it is also possible to, for all the exposure shots, prepare the surface shape data, calculate the shift amount from the plane of the exposed image, and to calculate the amounts by which the wafer stage is to be driven.

The wafer stage WS is not limited to a single stage and can also be constituted as the so-called twin stage including an exposure stage used for the exposure and a measurement stage used to perform the wafer alignment and the measurement of the wafer surface shape. In the latter case, the focus control sensor 33 and the shape measuring apparatus 200 are disposed on the side close to the measurement stage.

Because complicated circuit patterns, scribe lines, etc. are present on a wafer to be measured and/or processed by a semiconductor exposure apparatus, a distribution of reflectivity, a local tilt, etc. are generated at a higher incidence. In view of such a situation, this exemplary embodiment has a very valuable advantage in reducing measurement errors which are caused by the distribution of reflectivity and the local tilt. When the wafer surface position can be precisely measured, the accuracy in focus alignment between the optimum exposure plane and the wafer surface is increased. Hence, a further advantage can be obtained in improving the performance of semiconductor devices as final products and increasing the production yield.

Fifth Exemplary Embodiment

Figure 20:
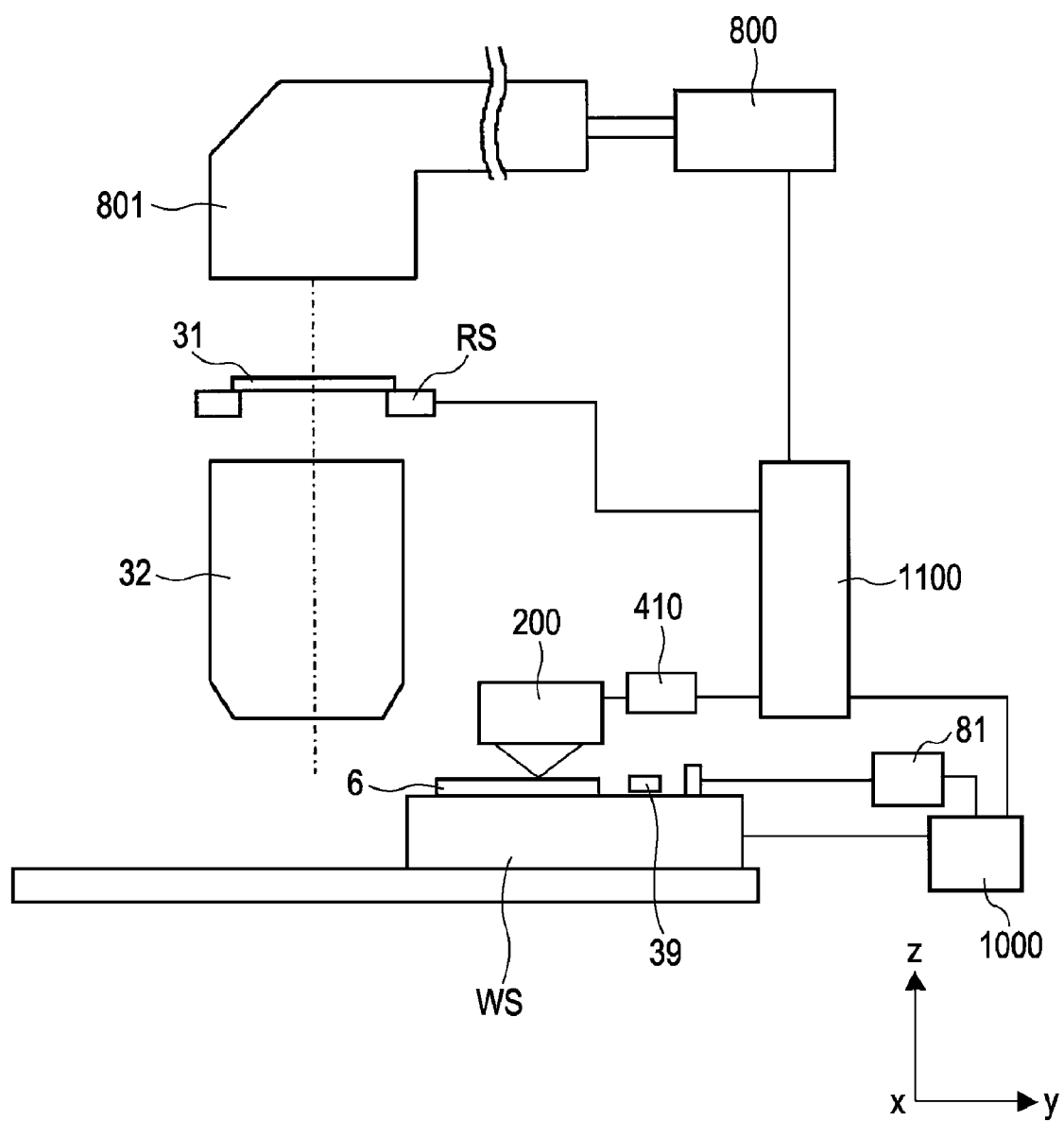
FIG. 20 is a block diagram illustrating an example exposure apparatus according to a fifth exemplary embodiment of the present invention.

A fifth exemplary embodiment of the present invention will be described below. FIG. 20 illustrates an exposure apparatus according to the fifth exemplary embodiment.

As illustrated in FIG. 20, the exposure apparatus according to the fifth exemplary embodiment comprises an illumination apparatus (light source unit) 800, an illumination optical system 801, a reticle stage RS, a projection optical system 32, a wafer stage WS, a reference plate 39, a shape measuring apparatus 200, and a processing unit 410 for the shape measuring apparatus 200. The reticle stage RS supports a reticle thereon, and the wafer stage WS supports a wafer (substrate) 6 thereon. The reference plate 39 is placed on the wafer stage WS.

The shape measuring apparatus 200 can be constituted as one according to any of the first and second exemplary embodiments. The foregoing exemplary embodiments have been described in connection with the case of separately providing the focus control sensor 33 and using the shape measuring apparatus 200 as a sensor for calibrating the focus control sensor 33. In contrast, the fifth exemplary embodiment is featured in omitting the focus control sensor 33 and measuring a surface position of the wafer 6 by the shape measuring apparatus 200. A control unit 1100 includes a CPU and a memory. The control unit 1100 is electrically connected to the illumination apparatus 800, the reticle stage RS, the wafer stage WS, the focus control sensor 33, and the shape measuring (focus calibrating) apparatus 200, thus controlling the operation of the exposure apparatus. In particular, reference numeral 1000 denotes a wafer stage (WS) control unit which has a function of controlling a driving profile of the wafer stage WS in accordance with a command from the control unit 1100. Because the construction and the functions of the exposure apparatus are substantially the same as those in the fourth exemplary embodiment except for the omission of the focus control sensor 33, a description thereof is not repeated here and the following description is given of a focus measuring method using the shape measuring apparatus 200.

Figure 21:
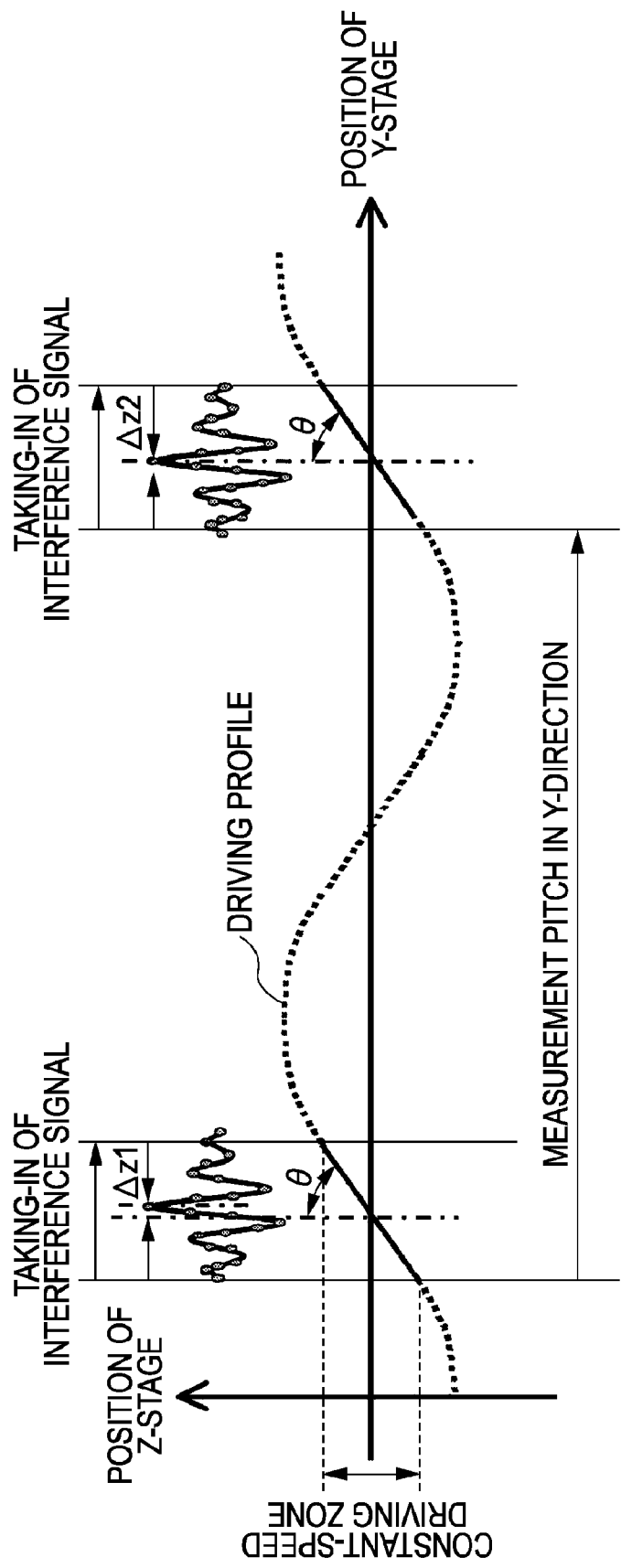
FIG. 21 is a chart showing the relationship between a stage driving profile and taking-in of the interference signal in the fifth exemplary embodiment of the present invention.

A method of measuring a resist surface position of the wafer 6 using the shape measuring apparatus 200 is described with reference to FIG. 21. FIG. 21 is a chart showing the relationship between a driving profile set to move the wafer 6 by the wafer stage WS and taking-in of an interference fringe (signal) by the shape measuring apparatus 200.

In FIG. 21, the horizontal axis represents the position of the Y-stage and the vertical axis represents the position of the Z-stage. The Y-stage moves the wafer 6 in the Y-direction, i.e., a direction parallel to the incident plane and the reflective plane of the measurement light (namely the surface of the wafer 6) in the shape measuring apparatus 200. The Z-stage moves the wafer 6 in the Z-direction, i.e., a direction perpendicular to the surface of the wafer 6. The term "incident plane" means a plane that is perpendicular to the reflective plane and includes the incident light and the reflected light.

The Y-stage is driven at a constant speed and the Z-stage is cyclically driven over a predetermined range. As shown in FIG. 21, the driving profile of the Z-stage is set to include a range where the Z-stage is driven at a constant speed. Assuming an angle of incidence upon the wafer 6 in the shape measuring apparatus 200 to be $\theta$, the relationship between a Y-stage speed Vy and a Z-stage speed Vz is set so as to provide a relative speed ratio of $Vy/Vz=\tan\theta$. Further, the shape measuring apparatus 200 detects a white interference signal at the timing where the Z-stage is driven at the constant speed. In other words, based on driving profile information from the stage control unit 1000, the control unit 1100 sets the timing of taking in the interference signal by the processing unit 410 to be matched with the timing at which the driving direction of the wafer 6 is matched with the direction of reflected light from the wafer 6. The driving profile information is precisely managed by a laser interferometer 81, and position information of the wafer 6 at the time of taking in the interference signal can also be precisely managed based on information obtained by the laser interferometer 81. Note that FIG. 20 illustrates the laser interferometer 81 as only a Y-axis gage interferometer for the sake of simplicity, but gage laser interferometers for total six axes, including X-axis, Z-axis, $\omega x$, $\omega y$, and $\omega z$ in addition to Y-axis, are actually provided.

Figure 22:
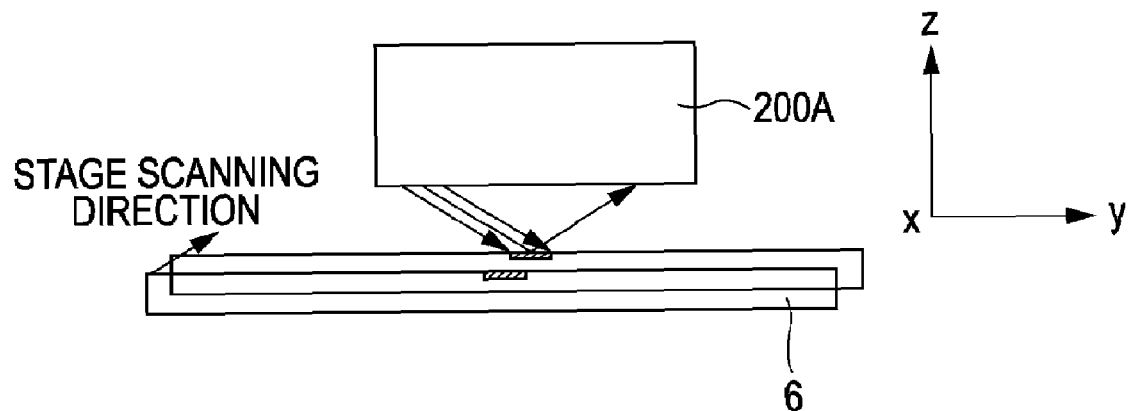
FIG. 22 is an explanatory view illustrating the shape measuring apparatus and a stage scanning direction in the fifth exemplary embodiment of the present invention.

In the range where the Y- and Z-stages are scanned at the relative speed ratio of $Vy/Vz=\tan\theta$, as illustrated in FIG. 22, the wafer scanning direction is matched with the direction of the reflected light that is produced with incidence of the light upon the wafer 20 in the shape measuring apparatus 200. Accordingly, the white interference signal can be obtained by using the light reflected from the same point on the wafer 6 as described above, and the wafer surface position can be accurately measured without being affected by a distribution of reflectivity caused due to the presence of the circuit pattern on the wafer 6.

Returning to FIG. 21, a description is now given of a measurement pitch in the Y-direction which can be measured by using the shape measuring apparatus 200.

Because the Y-stage is driven at a constant speed in the Y-direction and the Z-stage is cyclically driven in the Z-direction, the relationship between the Y-stage speed Vy and the Z-stage speed Vz satisfies Vy/Vz=tan θ per cycle. The distance through which the wafer 6 is moved in the Y-direction for a time corresponding to one cycle is defined as the measurement pitch in the Y-direction.

A practical numerical example is now herein provided as follows. Assuming that the angle θ of incidence upon the wafer 6 in the shape measuring apparatus 200 is 75 degrees and the speed of the Z-stage in the constant speed range is Vz=10 mm/sec, the speed of the Y-stage is given by Vy=10× tan(75°)=37.3 mm/sec. Assuming the driving cycle of the Z-stage to be 50 msec, the measurement pitch in the Y-direction is calculated as 37.3 mm/sec×50 msec=1.9 mm.

The interference signal on those conditions will be described next. Assuming that the height position of the wafer is Zw and the angle of incidence is θ, a change of the light path length can be expressed by 2Zw×cos θ. Therefore, a basic cycle Zp of the white interference signal with respect to the Z-axis can be approximated by Zp=λc/(2 cos θ) by using a center wavelength λc of the wide-band light source used in the shape measuring apparatus 200. In the case of λc=600 nm, for example, Zp=1.16 μm is calculated. Also, assuming a taking-in time for the interference signal to be 1 msec, the interference signal can be obtained from the movement range of 10 μm in the Z-direction. Since the basic cycle Zp of the interference signal is 1.16 μm, eight interference fringes can be substantially detected. Further, by using, as a photoelectric conversion element in the shape measuring apparatus 200, a photodiode or a photodiode array which has a high response speed, the intensity of the interference signal can be measured for a sampling time of about 0.01 msec. Such a sampling time can be converted to a distance of 0.01 msec×10 mm/sec=100 nm in the Z-direction. In other words, the white interference signal can be sufficiently recognized by taking in the eight interference signals, and the sampling pitch in the Z-direction can be set to 100 nm. Thus, by executing the signal processing as described in the foregoing exemplary embodiments, a peak position of the interference signal can be measured at resolution of about 1/50 of the sampling pitch 100 nm in the Z-direction, i.e., about 2 nm. Since the peak position can be detected at resolution of 2 nm, the shape measurement can also be achieved with resolution of 2 nm.

Figure 24:
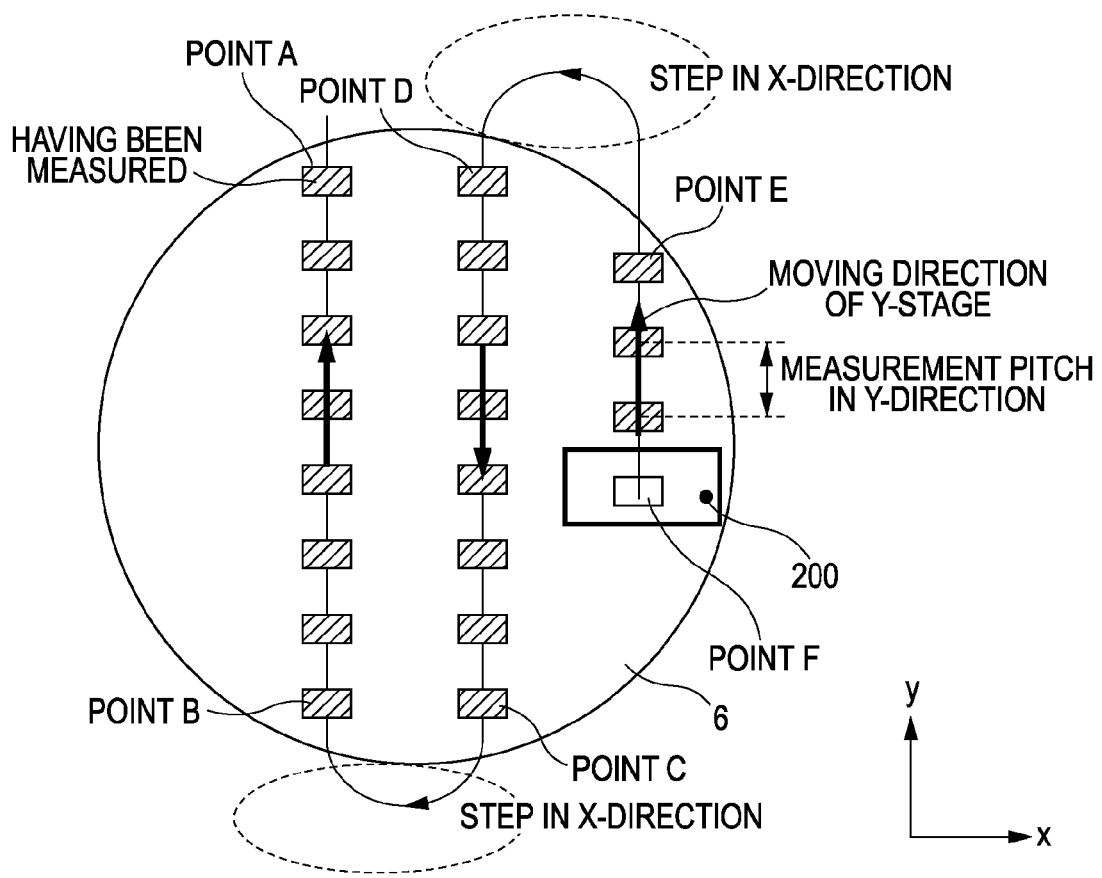
FIG. 24 illustrates the relationship between an XY stage driving method and measurement points in the fifth exemplary embodiment shown in FIG. 22.

A measurement point on the wafer 6 in the direction of height and a method of driving the wafer stage WS in the XY-directions will be described next with reference to FIG. 24. FIG. 24 illustrates the relationship among the shape measuring apparatus 200, measurement points of the shape measuring apparatus 200, and a driving pattern of the wafer stage WS in the XY-directions. In the case of FIG. 24, for example, the measurement has been started from a point A on the wafer 6 and is now being performed at a point F after passing points B, C, D and E successively. The measurement pitch in the Y-direction in FIG. 24 is 1.9 mm according to the above-described numerical example. More specifically, after performing the measurement at the point A by the shape measuring apparatus 200, the Y-stage is scanned at the constant speed Vy in the Y-plus direction to perform the measurement at successive points until reaching the point B near a lower edge of the wafer 6. After passing the wafer edge, as illustrated in FIG. 24, the X-stage is driven to step in the X-direction while the Y-stage is decelerated and then accelerated in the Y-minus direction. The acceleration is ended before the measurement point C near the wafer edge comes to the measurement position of the shape measuring apparatus 200. Thereafter, the Y-stage is driven again at the constant speed Vy in the Y-minus direction. When the measurement is completed for subsequent measurement points from the point C to D which is located near an upper edge of the wafer 6, the X-stage is likewise driven again to step in the X-direction and the Y-stage is controlled such that the Y-stage can be driven at the constant speed Vy in the Y-plus direction until reaching the next measurement point E, i.e., the point E. During a period in which the Y-stage is driven at the constant speed Vy in the Y-plus or Y-minus direction, the Z-stage is also required to be driven at the constant speed Vz in the Z-plus or Z-minus direction so as to satisfy Vy/Vz=tan θ.

By repeating the above-described operation over the entire wafer surface, height information regarding the entire surface of the wafer 6 can be obtained at the predetermined pitch with respect to the X- and Y-directions.

After obtaining the height information of the wafer 6 as described above, the exposure sequence is performed while, based on the measured wafer shape, precisely positioning the wafer so that the height position of the wafer 6 is matched with the optimum imaging plane of the projection lens 32 in FIG. 20. In practice, for an area which can be exposed at a time (about 22-mm square in a stepper and an exposure slit width of about 8 mm×25 mm in a scanner), an approximate plane is calculated by using the least square method based on the height information measured by the shape measuring apparatus 200. Thereafter, the exposure is performed while precisely positioning the wafer in the Z-direction and the tilt directions (ωx, ωy) so that the calculated approximate plane is matched with the optimum imaging plane of the projection lens 32.

While the stage scanning speed during the exposure is not necessarily required to be matched with the scanning speed during the shape measurement of the wafer 6, the stage scanning speed is desirably set to a value as high as possible in a practically allowable range.

With the shape measuring apparatus of the fifth exemplary embodiment, as described above, the shape measurement of the wafer 6 can be performed while scanning the wafer 6 in the Y- and Z-directions. Therefore, the fifth exemplary embodiment is advantageous in realizing a much higher throughput than the method of scanning the wafer in the Y- and Z-directions after the positioning for each measurement point in the XYZ-directions.

Sixth Exemplary Embodiment

Figure 23:
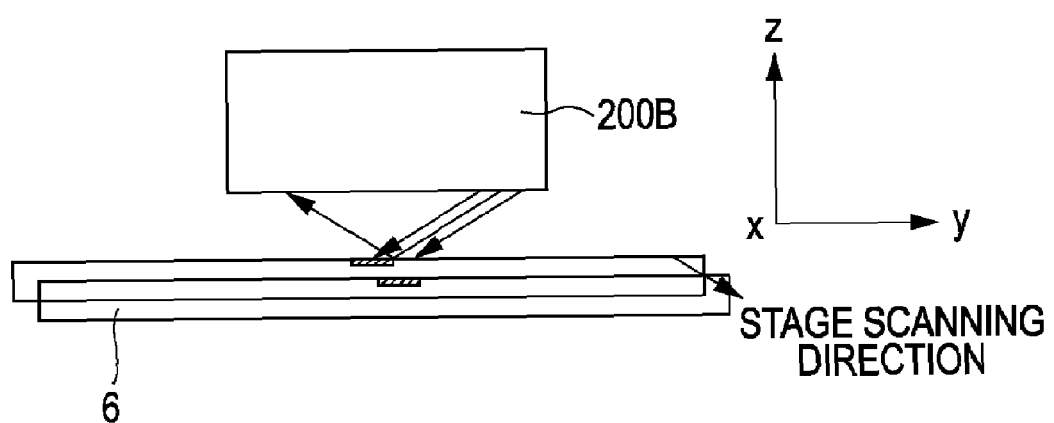
FIG. 23 is an explanatory view illustrating the stage scanning direction when the direction of incidence of light is reversed in the shape measuring apparatus.
Figure 26:
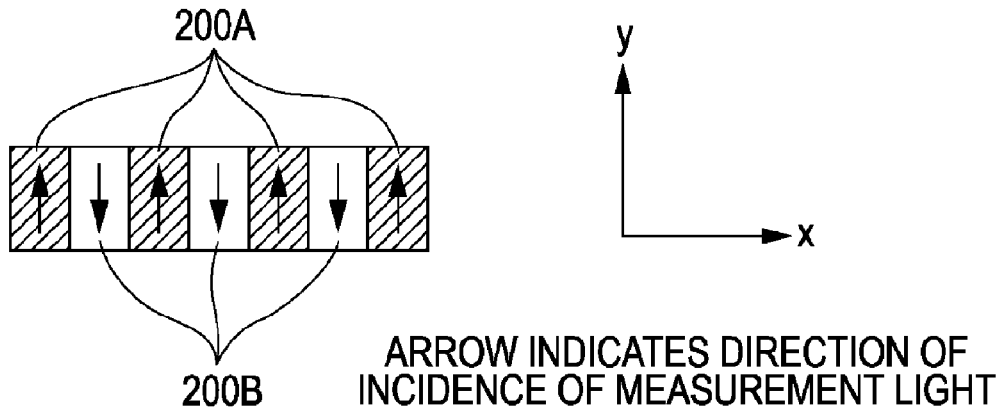
FIG. 26 is an explanatory view illustrating an arrangement of interferometers (constituting shape measuring apparatuses) according to the sixth exemplary embodiment of the present invention.

A sixth exemplary embodiment of the present invention will be described next. The sixth exemplary embodiment is an improved version of the fifth exemplary embodiment and is featured in that a shape measuring apparatus is constituted by an interferometer 200A (FIG. 22) which constitutes the shape measuring apparatus of the fifth exemplary embodiment, and an interferometer 200B (FIG. 23) which is constituted by orienting the shape measuring apparatus such that the direction of incidence of the measurement light is reversed. In other words, as shown in FIG. 26, the interferometers 200A and 200B are arranged side by side in the X-direction such that they are alternately reversed in orientation. The arrangement according to one of the first exemplary embodiment and the second exemplary embodiment can be used as each of the interferometers 200A and 200B.

Figure 25:
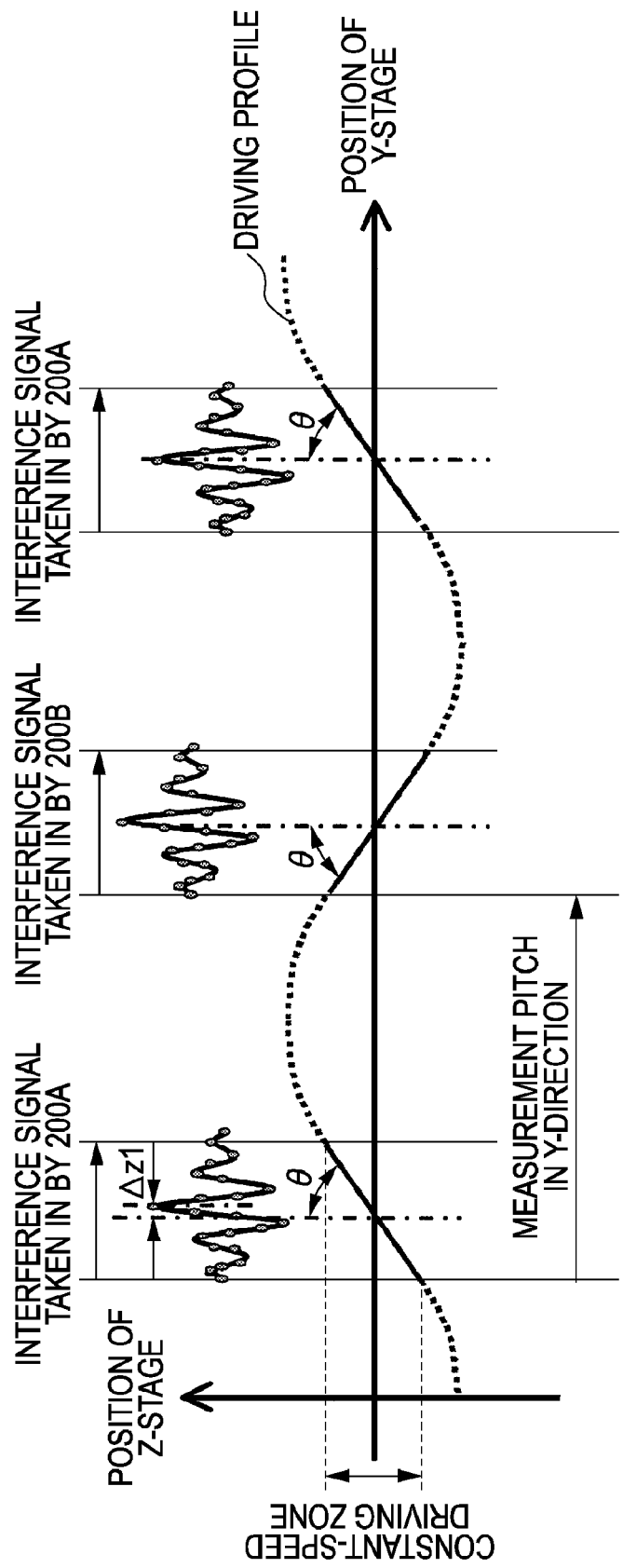
FIG. 25 is a chart showing the relationship between a stage driving profile and taking-in of the interference signal in a sixth exemplary embodiment of the present invention.

A measurement method using the shape measuring apparatus according to the sixth exemplary embodiment will be described next with reference to FIG. 25. FIG. 25 is a chart showing the relationship between a driving profile set to move the wafer 6 by the wafer stage WS and the timing of taking in the interference fringes by the interferometer 200A and the interferometer 200B.

In FIG. 25, the horizontal axis represents the position of the Y-stage and the vertical axis represents the position of the Z-stage. The Y-stage is driven at a constant speed and the Z-stage is cyclically driven over a predetermined range. As shown in FIG. 25, the driving profile of the Z-stage is set to include a range where the Z-stage is driven at a constant speed. Assuming an angle of incidence upon the wafer 6 in the shape measuring apparatus 200 to be $\theta$, the relationship between a Y-stage speed Vy and a Z-stage speed Vz is set so as to provide a relative speed ratio of Vy/Vz=tan $\theta$. Further, the interferometer 200A and the interferometer 200B each detect a white interference signal at the timing where the Z-stage is driven at the constant speed. In addition, the interferometer 200A and the interferometer 200B each detect the white interference signal at the timing at which the direction of reflected light from the wafer 6 is matched with the stage scanning direction.

More specifically, the interferometer 200A detects the interference signal when the Y-stage and the Z-stage are driven at the constant speeds in the Y-plus direction and the Z-plus direction, respectively. On the other hand, the interferometer 200B detects the interference signal when the Y-stage and the Z-stage are driven at the constant speeds in the Y-plus direction and the Z-minus direction, respectively. Further, the interferometer 200A detects the interference signal when the Y-stage and the Z-stage are driven at the constant speeds in the Y-minus direction and the Z-minus direction, respectively, and the interferometer 200B detects the interference signal when the Y-stage and the Z-stage are driven at the constant speeds in the Y-minus direction and the Z-plus direction, respectively.

Figure 27:
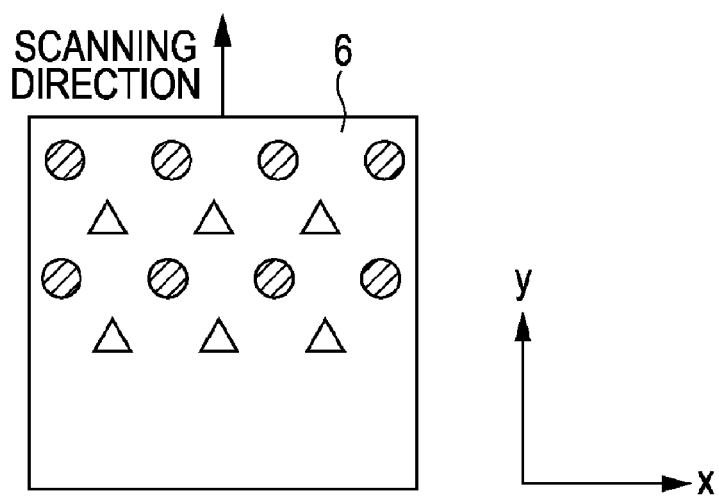
FIG. 27 is an explanatory view illustrating measurement points in the sixth exemplary embodiment of the present invention.

By using one interferometer in combination with the other interferometer in which the direction of incidence of the measurement light is reversed from that in the one interferometer, the measurement pitch in the Y-direction can be reduced as shown in FIG. 25. FIG. 27 illustrates measurement points on the wafer 6 when the interferometer A (200A) and the interferometer B (200B) are combined with each other as shown in FIG. 26. As seen from FIG. 27, the height information regarding the surface of the wafer 6 can be measured at a smaller sampling pitch in the Y-direction, i.e., a half the pitch in the fifth exemplary embodiment.

A method of measuring the entire surface of the wafer 6 is the same as that in the above-described exemplary embodiments and therefore a description of the method is not repeated here. As in the fifth exemplary embodiment, the shape measuring apparatus according to the sixth exemplary embodiment can also be used as a focus detection system in the exposure apparatus.

The combination of the interferometer A (200A) and the interferometer B (200B), shown in FIG. 26, is one example and those interferometers can also be disposed in some other suitable arrangement. By arranging a plurality of interferometers in the Y-direction, the shape of the wafer 6 can be measured at an even smaller pitch in the Y-direction.

Seventh Exemplary Embodiment

A seventh exemplary embodiment of the present invention will be described next with reference to FIG. 28. A shape measuring apparatus 200 according to the seventh exemplary embodiment serves an apparatus detecting a surface position of a substrate (wafer) 6, i.e., a measurement target, in the Z-direction, and it is constituted as follows.

Figure 28:
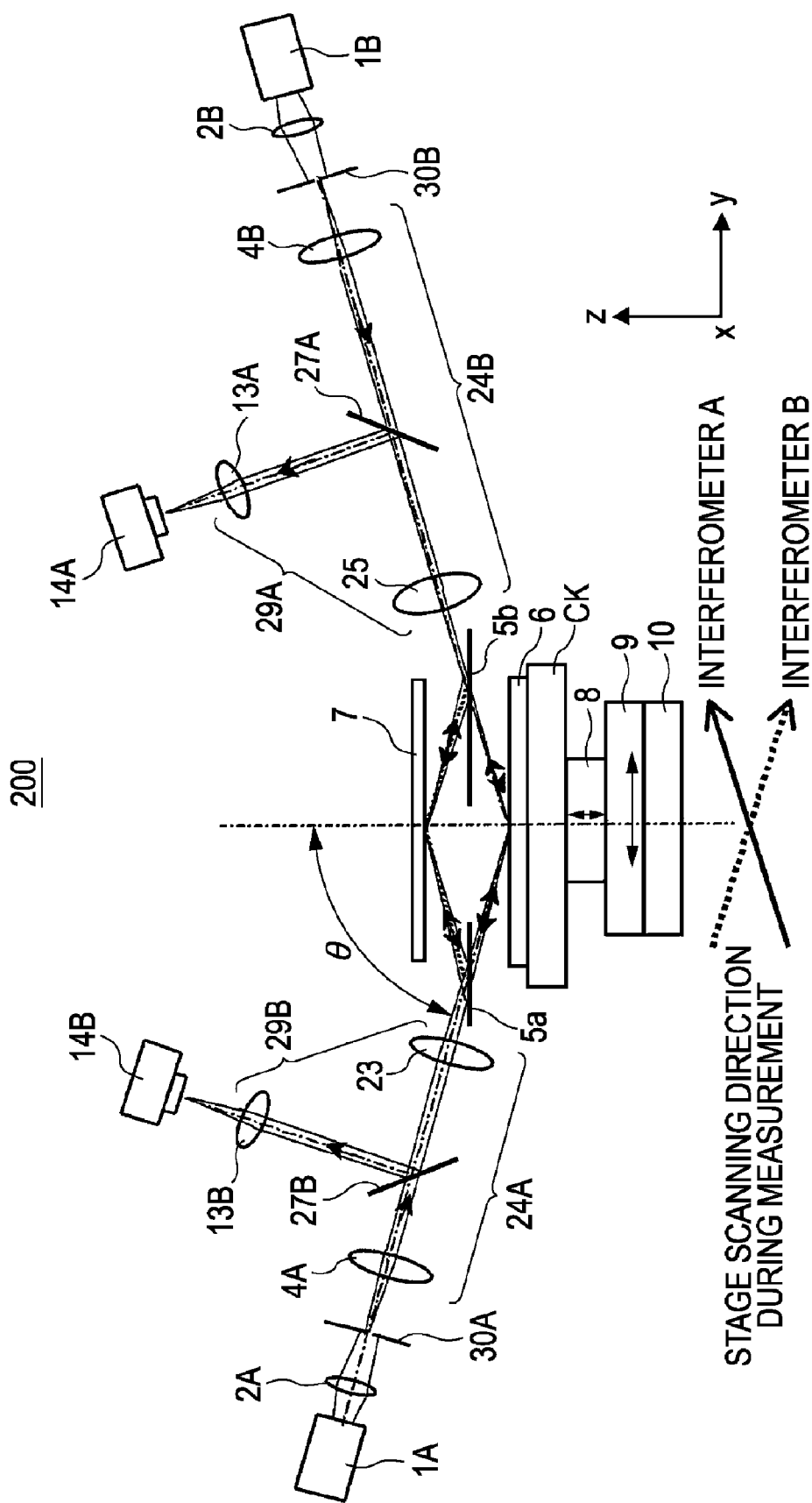
FIG. 28 is a schematic view illustrating a shape measuring apparatus according to a seventh exemplary embodiment of the present invention.

Now referring to FIG. 28, the shape measuring apparatus 200 includes light sources 1A and 1B, condenser lenses 2A and 2B, slit plates 30A and 30B, imaging optical systems 24A and 24B, and beam splitters 5a and 5b each serving to split and combine light. The light sources 1A and 1B are each an LED (including the so-called white LED) or a halogen lamp, which emits wide-band light having a wide wavelength width.

Further, the shape measuring apparatus 200 includes a substrate chuck CK which holds the measurement target (substrate) 6, a Z-stage 8, a Y-stage 9 and an X-stage 10 which precisely align (register) the position of the measurement target, a reference mirror 7, and detectors 14A and 14B. The detectors 14A and 14B serve as photoelectric conversion elements which can be each formed of an image pickup element such as a CCD or CMOS sensor, a photodiode.

Moreover, the shape measuring apparatus 200 includes an imaging optical system 29A made up of lenses 25 and 13A arranged to image the surface of the substrate 6 on the detector 14A, and an imaging optical system 29B made up of lenses 23 and 13B arranged to image the surface of the substrate 6 on the detector 14B.

Detailed functions of the components in the seventh exemplary embodiment will be described below. In FIG. 28, the light emitted from the light source 1A is condensed onto the slit plate 30A by the condenser lens 2A. The slit plate 30A has a rectangular transmittable (slit) area with a slit width of 50 µm and a length of 700 µm (in the direction of the X-axis) such that a rectangular image is formed by the imaging optical system 24A on each of the substrate 6 and the reference mirror 7. A principal beam of the light having passed through the imaging optical system 24A impinges upon the substrate 6 at an angle $\theta$ of incidence. Because the beam splitter 5a is disposed midway a light path downstream of the imaging optical system 24A, a light beam having about ½ of total light quantity is reflected by the beam splitter 5a and impinges upon the reference mirror 7 at the same angle $\theta$ of incidence as that for the substrate 6.

The light having passed through the beam splitter 5a is illuminated to the substrate 6, and the reflected light from the substrate 6 (hereinafter referred to as "measurement light") enters the beam splitter 5b. On the other hand, the light reflected by the beam splitter 5a is illuminated to the reference mirror 7, and the reflected light from the reference mirror 7 (hereinafter referred to as "reference light") enters the beam splitter 5b. Because the light source 1A, the polarization state of the light, the angle $\theta$ of incidence, the beam splitters, the reference mirror, etc. are the same as those in the first exemplary embodiment, a detailed description of those components is not repeated here.

The measurement light reflected by the substrate 6 and the reference light reflected by the reference mirror 7 are combined with each other by the beam splitter 5b and are both detected by the image pickup element (detector) 14A after being reflected by a beam splitter 27A. Thus, in the seventh exemplary embodiment, the transmittable area of the slit plate 30A is imaged on each of the substrate 6 and the reference mirror 7 by the imaging optical system 24A, and it is further imaged again on the light receiving surface of the image pickup element 14A by the imaging optical system 29A.

An aperture stop (not shown) disposed near the pupil position of the imaging optical system 29A serves to specify the numerical aperture (NA) of the imaging optical system 29A such that the NA is set to a very small value in the range of sin (0.5°) to sin (5°). On the light receiving surface of the image pickup element 14A, the measurement light and the reference light are overlapped with each other to cause interference of both the lights. An interferometer A using the light incoming from the left side in FIG. 28 has the above-described construction.

The construction of an interferometer B using the light incoming from the right side in FIG. 28 will be described next. In FIG. 28, the light emitted from the light source 1B is condensed onto the slit plate 30B by the condenser lens 2B. The slit plate 30B has a rectangular transmittable (slit) area with a slit width of 50 μm and a length of 700 μm (in the direction of the X-axis) such that a rectangular image is formed by the imaging optical system 24B on each of the substrate 6 and the reference mirror 7. A principal beam of the light having passed through the imaging optical system 24B impinges upon the substrate 6 at an angle θ of incidence. Because the beam splitter 5b is disposed midway a light path downstream of the imaging optical system 24B, a light beam having about ½ of total light quantity is reflected by the beam splitter 5b and impinges upon the reference mirror 7 at the same angle θ of incidence as that for the substrate 6.

The light having passed through the beam splitter 5b is illuminated to the substrate 6, and the reflected light from the substrate 6 (hereinafter referred to as "measurement light") enters the beam splitter 5a. On the other hand, the light reflected by the beam splitter 5b is illuminated to the reference mirror 7, and the reflected light from the reference mirror 7 (hereinafter referred to as "reference light") enters the beam splitter 5a. Because the light source 1B, the polarization state of the light, the angle θ of incidence, the beam splitters, the reference mirror, etc. are the same as those in the first exemplary embodiment, a detailed description of those components is not repeated here.

The measurement light reflected by the substrate 6 and the reference light reflected by the reference mirror 7 are combined with each other by the beam splitter 5a and are both detected by the image pickup element (detector) 14B after being reflected by a beam splitter 27B. Thus, the transmittable area of the slit plate 30B is imaged on each of the substrate 6 and the reference mirror 7 by the imaging optical system 24B, and it is further imaged again on the light receiving surface of the image pickup element 14B by the imaging optical system 29B.

An aperture stop (not shown) disposed near the pupil position of the imaging optical system 29B serves to specify the numerical aperture (NA) of the imaging optical system 29B such that the NA is set to a very small value in the range of sin (0.5°) to sin (5°). On the light receiving surface of the image pickup element 14B, the measurement light and the reference light are overlapped with each other to cause interference of both the lights.

A method of obtaining a white interference signal and a method of processing the white interference signal are not described here because the methods described above in the fifth exemplary embodiment can be similarly applied to each of the interferometer A using the light incoming from the left side and the interferometer B using the light incoming from the right side.

In the shape measuring apparatus according to the seventh exemplary embodiment, the interferometers A (200A) and the interferometer B (200B) according to the sixth exemplary embodiment are combined with each other in a different way. While the interferometers A and B in the sixth exemplary embodiment are combined so as to measure different points shifted in the X-direction, the interferometers A and B in the seventh exemplary embodiment are able to measure the same point in the X-direction. Further, the components can be partly shared by the two interferometers. That feature is effective in realizing a more compact apparatus and reducing the cost.

A method of measuring, when the substrate 6 is a wafer, the entire surface of the wafer 6 is the same as that in the fifth exemplary embodiment and therefore a description of the method is not repeated here. As in the fifth and sixth exemplary embodiments, the shape measuring apparatus according to the seventh exemplary embodiment can also be used as a focus detection system in the exposure apparatus.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Patent Application No. 2006-346203 filed Dec. 22, 2006 and Japanese Patent Application No. 2007-278962 filed Oct. 26, 2007, which are hereby incorporated by reference herein in their entirety.

What is claimed is:

1. A shape measuring method for measuring a surface shape of a measurement target, the method comprising:
    dividing light from a light source into measurement light and reference light, the measurement light being obliquely incident upon a surface of the measurement target, the reference light being incident upon a reference mirror;
    introducing the measurement light reflected by the measurement target and the reference light reflected by the reference mirror to a photoelectric conversion element;
    detecting interference light formed by the measurement light and the reference light by the photoelectric conversion element while changing a path length difference between the measurement light and the reference light by moving the measurement target; and
    measuring the surface shape of the measurement target based on an interference signal, wherein the interference signal is obtained by detecting the interference light by the photoelectric conversion element while changing a path length difference between the measurement light and the reference light by moving the measurement target in a direction in which the measurement light is reflected.

2. The shape measuring method according to claim 1, further comprising moving the measurement target at constant speeds in directions parallel to a plane of incidence of the measurement light and the surface of the measurement target, and cyclically moving the measurement target in a direction perpendicular to the surface of the measurement target,
    wherein the interference signal is obtained by detecting the interference light by the photoelectric conversion element at timing at which the measurement target is moved in the direction parallel to the direction in which the measurement light is reflected.

3. The shape measuring method according to claim 1, wherein the measurement target is driven in the direction so that a driven amount of Zs of the measurement target in a direction normal to a surface of the measurement target and a driven amount Ys of the measurement target in the direction of a line at which the surface of the measurement target and a plane of incidence of the measurement light cross always satisfy the relationship Ys/Zs=tan θ, and
    wherein θ is angle of reflection of the measurement light.

4. A shape measuring method for measuring a surface share of a measurement target, the method comprising:
- dividing light from a light source into measurement light and reference light, the measurement light being obliquely incident upon a surface of the measurement target, the reference light being incident upon a reference mirror;
- introducing the measurement light reflected by the measurement target and the reference light reflected by the reference mirror to a photoelectric conversion element;
- detecting interference light formed by the measurement light and the reference light by the photoelectric conversion element; and
- measuring the surface share of the measurement target based on an interference signal obtained by the photoelectric conversion element,
- wherein the interference signal is obtained while changing a pixel of the photoelectric conversion element, so that the interference signal is obtained from the measurement light that has been reflected at the same position on the surface of the measurement target in sync with the movement of the measurement target.

5. A shape measuring apparatus configured to measure a surface shape of a measurement target, the apparatus comprising:
- a light sending optical system arranged to divide light from a light source into measurement light and reference light, the measurement light being obliquely incident upon a surface of the measurement target, the reference light being incident upon a reference mirror;
- a light receiving optical system arranged to introduce the measurement light reflected by the measurement target and the reference light reflected by the reference mirror to a photoelectric conversion element; and
- a driving mechanism configured to move the measurement target,
- wherein the photoelectric conversion element detects interference light formed by the measurement light and the reference light, and
- wherein the surface shape of the measurement target is measured based on an interference signal obtained by the photoelectric conversion element,
- wherein the interference signal is obtained while changing a pixel of the photoelectric conversion element, so that the interference signal is obtained from the measurement light that has been reflected at the same position on the surface of the measurement target, in sync with the movement of the measurement target.

6. An exposure apparatus configured to expose a substrate in accordance with a pattern on an original, the apparatus comprising:
- the shape measuring apparatus according to claim 5,
- wherein a resist is coated on a surface of the substrate, and the shape measuring apparatus measures a surface shape of the substrate or the resist.

7. A shape measuring apparatus configured to measure a surface shape of a measurement target, the apparatus comprising:
- a light sending optical system arranged to divide light from a light source into measurement light and reference light, the measurement light being obliquely incident upon a surface of the measurement target, the reference light being incident upon a reference mirror;
- a light receiving optical system arranged to introduce the measurement light reflected by the measurement target and the reference light reflected by the reference mirror to a photoelectric conversion element; and
- a driving mechanism configured to move the measurement target,
- wherein the photoelectric conversion element detects interference light formed by the measurement light and the reference light, and
- wherein the surface shape of the measurement target is measured based on an interference signal,
- wherein the interference signal is obtained by detecting the interference light by the photoelectric conversion element while changing a path length difference between the measurement light and the reference light by moving the measurement target in a direction in which the measurement light is reflected.

8. The shape measuring method according to claim 7,
- wherein the driving mechanism moves the measurement target at constant speeds in directions parallel to a plane of incidence of the measurement light and the surface of the measurement target, and cyclically moves the measurement target in a direction perpendicular to the surface of the measurement target, and
- wherein the interference signal is obtained by detecting the interference light by the photoelectric conversion element at timing at which the measurement target is moved in the direction parallel to the direction in which the measurement light is reflected.

9. A shape measuring apparatus configured to measure a surface shape of a measurement target, the apparatus comprising:
- a first interferometer; and
- a second interferometer,
- wherein the first interferometer and the second interferometer are each constituted by the shape measuring apparatus according to claim 8, and
- a direction of incidence of the measurement light upon the first interferometer is reversed from a direction of incidence of the measurement light upon the second interferometer.

* * * * *